(12) United States Patent  (10) Patent No.: US 9,161,484 B2
Baarman et al.  (45) Date of Patent: Oct. 13, 2015

(54) SELECTIVELY CONTROLLABLE ELECTROMAGNETIC SHIELDING

(75) Inventors: David W. Baarman, Fennville, MI (US); William T. Stoner, Jr., Ada, MI (US); Joshua K. Schwannecke, Grand Rapids, MI (US); Kaitlyn J. Turner, Kentwood, MI (US); Benjamin C. Moes, Wyoming, MI (US)

(73) Assignee: Access Business Group International LLC, Ada, MI (US)

( * ) Notice: Subject to any disclaimer, the term of this patent is extended or adjusted under 35 U.S.C. 154(b) by 858 days.

(21) Appl. No.: 13/241,521

(22) Filed: Sep. 23, 2011

(65) Prior Publication Data

US 2012/0112552 A1  May 10, 2012

Related U.S. Application Data

(60) Provisional application No. 61/444,926, filed on Feb. 21, 2011, provisional application No. 61/386,535, filed on Sep. 26, 2010.

(51) Int. Cl.
  *H04B 5/00* (2006.01)
  *H05K 9/00* (2006.01)
  (Continued)

(52) U.S. Cl.
  CPC ............ *H05K 9/0088* (2013.01); *B60L 11/182* (2013.01); *H01F 27/362* (2013.01);
  (Continued)

(58) Field of Classification Search
  CPC ........................................................ H04B 5/00

USPC .......................................................... 307/104
See application file for complete search history.

(56) References Cited

U.S. PATENT DOCUMENTS 4,977,040 A  12/1990  Yano et al.
5,329,165 A  7/1994  Kao et al.
(Continued)

FOREIGN PATENT DOCUMENTS

GB  2 388 716  11/2003
JP  S55-093514  7/1980
(Continued)

OTHER PUBLICATIONS

International Search Report for App. No. PCT/US2011/052904, mailed Mar. 2, 2012.
(Continued)

*Primary Examiner* — Adi Amrany
(74) *Attorney, Agent, or Firm* — Warner Norcross & Judd LLP

(57) ABSTRACT

A selectively controllable electromagnetic shield having an electromagnetic shielding material and a mechanism for selectively generating an aperture in the shield. The mechanism for selectively generating an aperture may be a magnetic field source that generates a magnetic field of sufficient strength to substantially saturate all or a portion of the shielding material. For example, a permanent magnet or DC electromagnet may be used to selectively saturate the shield. In its un-saturated state, the magnetic shield has a high permeability and functions as a flux path for the magnetic field. Once saturated, the permeability of the shield is substantially reduced so that the magnetic field lines are no longer drawn into the shield to the same degree. As a result, once saturated, a substantially greater amount of the electromagnetic field may flow through or around the shield in the saturated region.

23 Claims, 26 Drawing Sheets

(51) Int. Cl.
*H01F 38/14* (2006.01)
*H01F 27/36* (2006.01)
*B60L 11/18* (2006.01)
*H02J 7/02* (2006.01)

(52) U.S. Cl.
CPC ............... *H01F 38/14* (2013.01); *H04B 5/00* (2013.01); *H05K 9/002* (2013.01); *H02J 7/025* (2013.01); *Y02T 10/7005* (2013.01); *Y02T 90/122* (2013.01); *Y02T 90/14* (2013.01); *Y10T 29/49002* (2015.01)

(56) References Cited

U.S. PATENT DOCUMENTS

| | | | |
|---|---|---|---|
| 5,528,113 A | | 6/1996 | Boys et al. |
| 6,121,544 A | * | 9/2000 | Petsinger ............... 174/353 |
| 7,220,488 B2 | * | 5/2007 | Wadle et al. ............ 428/432 |
| 7,675,197 B2 | | 3/2010 | Tetlow |
| 8,629,653 B2 | * | 1/2014 | Mochida et al. ......... 320/108 |
| 2007/0040030 A1 | * | 2/2007 | Kranzley et al. ......... 235/451 |
| 2011/0050164 A1 | * | 3/2011 | Partovi et al. ........... 320/108 |
| 2011/0062793 A1 | * | 3/2011 | Azancot et al. .......... 307/116 |
| 2012/0242447 A1 | * | 9/2012 | Ichikawa ................. 336/84 C |

FOREIGN PATENT DOCUMENTS

| | | |
|---|---|---|
| JP | S62-189626 | 8/1987 |
| JP | H02-239604 | 9/1990 |

OTHER PUBLICATIONS

Written Opinion of the International Searching Authority for App. No. PCT/US2011/052904, mailed Mar. 2, 2012.

Jiang, Zhengrong, Li, Zhengxi, and Chen, Jianye, "Magnetic Field Distribution of a Novel Variable Inductor Based on Orthogonal Magnetization," Progress in Electromagnetics Research Symposium (PIERS) Proceedings, Cambridge, USA, Jul. 5-8, 2010, pp. 46-49.

* cited by examiner

Magnetization Curves of Nine Ferromagnetic Materials
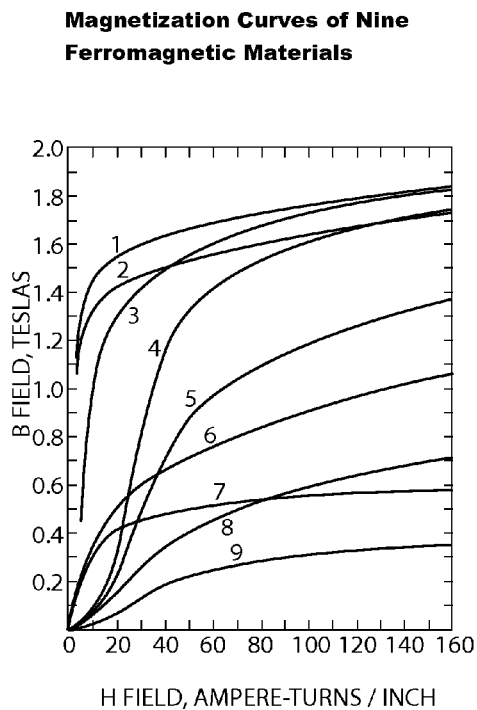
Hysteresis Curve of a Typical Soft Magnetic Material
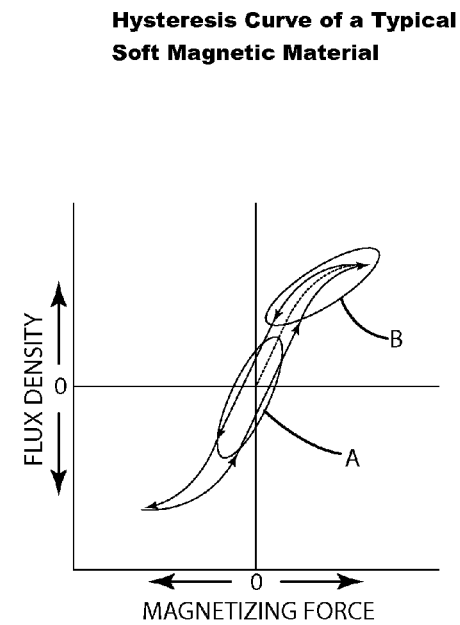
Fig. 13
Legend:
1. Sheet Steel
2. Silicon Steel
3. Cast Steel
4. Tungsten Steel
5. Magnet Steel
6. Cast Iron
7. Nickel
8. Cobalt
9. Magnetite
Fig. 12

INTERMEDIATE SHIELD MATERIALS

| Properties | Flexible composite Ferrite | Pre-fractured Ferrite | Bonded Iron |
|---|---|---|---|
| Initial Permeability, ($\mu_i$) | High | Very High | Relatively Low |
| Saturation | Low | Medium | High |
| Conductivity/ Losses | Low | Less | Relatively High |

Fig. 15

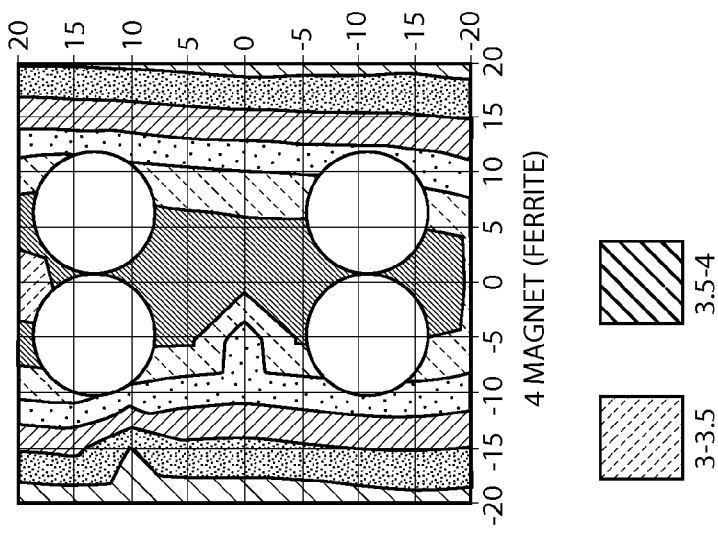
Fig. 17A  Fig. 17B  Fig. 17C
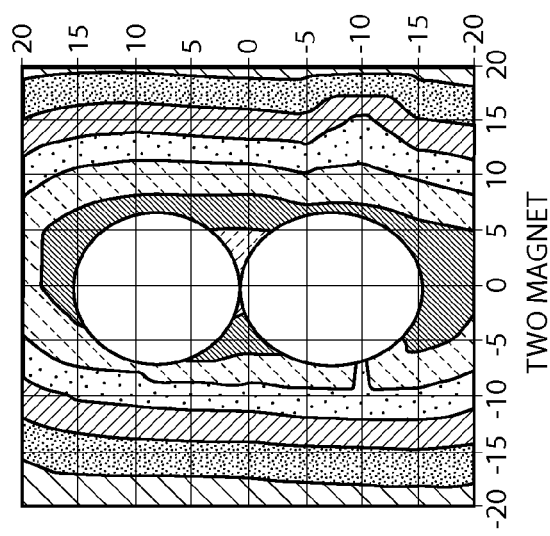
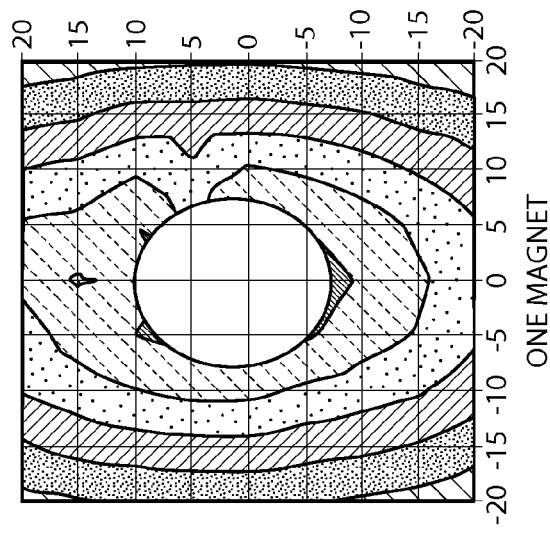

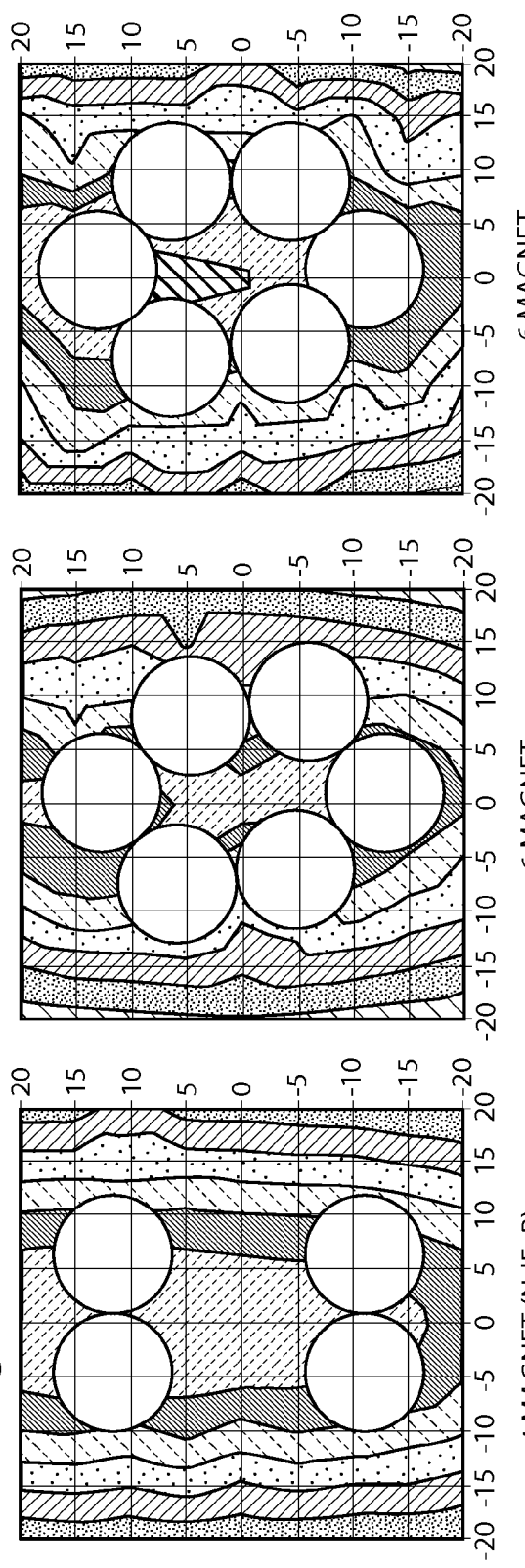

When only the shielding material is present

| Material | Power Output (Watts) | Power Input (Watts) | Efficiency (%) |
|---|---|---|---|
| Flexible IRJ09 | 0.0874 | 0.6008 | 14.546 |
| Pre-fractured ferrite | 0.0718 | 0.4928 | 14.585 |

Fig. 18A

When magnets are present along with the shielding material

| Material | Power Output (Watts) | Power Input (Watts) | Efficiency (%) |
|---|---|---|---|
| Flexible IRJ09 | 0.3546 | 0.4317 | 82.141 |
| Pre-fractured ferrite | 0.4754 | 1.0854 | 43.802 |

Fig. 18B

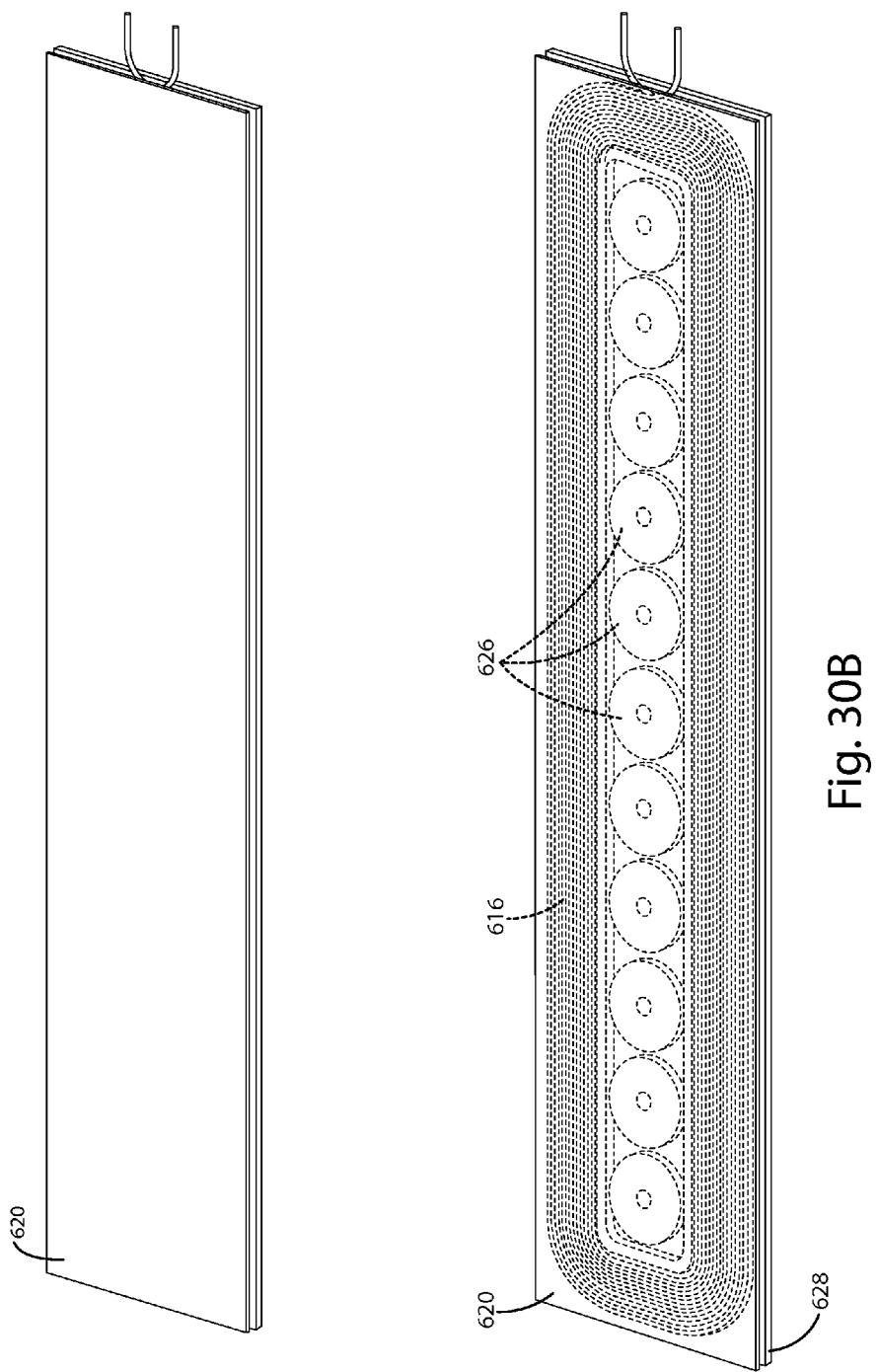

SELECTIVELY CONTROLLABLE ELECTROMAGNETIC SHIELDING

The present invention relates to electromagnetic shielding and more particularly to systems and methods for providing selective control over electromagnetic shielding.

BACKGROUND

In recent years, there has been a widespread increase in efforts to implement wireless power transfer systems in both commercial and residential settings. Wireless power systems offer the promise of eliminating power/charging cords for a wide range of electrically powered devices, including not only handheld electronics, such as cell phones, media players, wireless headsets and personal digital assistants, but also higher power devices, such as appliances, tools and electric vehicles. Efficient inductive power transfer has become an area of increasing scientific interest as it can solve some problems associated with traditional wired or contact power transmission. These include but are not limited to corrosion, mechanical friction, clutter and impracticality in places like underwater and subterranean applications. This wireless energy transfer is improved by the optimization of electromagnetic induction, circuit frequency resonance all achieved with advanced power electronics. One of the components of this technology is the precise delivery of the incident electromagnetic fields to the precise location where they are converted to power without broadcasting these fields inefficiently into the surrounding areas. Inductive wireless power transfer systems use electromagnetic fields to transfer power from the power supply to the remote device without the need for wires or any direct electrical contact. Given the nature of electromagnetic fields, many conventional wireless power systems provide improved performance with relatively close alignment between the wireless power supply and the remote device. This has lead to the development of wireless power transfer systems in which the remote device is placed in a specific location or within a relatively small distance from a specific location. For example, it is known to use parallel planar spiral coils in the wireless power supply (e.g. primary) and in the remote device (e.g. secondary) that are concentrically aligned in face-to-face relationship during power transfer. In these types of systems, the primary and secondary are typically of similar size. In some known solutions, the wireless power supply is in a housing, or dock, with a signature surface that forces the portable device to be placed in a specific target location and in a specific orientation. Although providing efficient power transfer, these types of systems lack the desired amount positional freedom that might be desired in some applications.

Although eliminating power/charging cords is by itself a significant and meaningful advantage, wireless power transfer may be even more appealing if the need for close alignment between the wireless power supply and the remote device was reduced or eliminated. From a user perspective, it can be desirable to be able to place a portable device in a random position and a random orientation within the boundaries of a charging surface. It may be even more desirable to the user if the target zone is substantially larger than the secondary device, thus allowing freedom from specific placement and orientation. With this in mind, a number of wireless power transfer systems have been developed to provide increased spatial freedom in aligning the remote device with the wireless power transfer supply. For example, it is known to use a large primary coil to transmit power to one or more smaller secondary coils which are located within the diameter of the large primary coil. Although providing increased spatial freedom, the large primary coil can increase stray electromagnetic fields and dramatically increase parasitic losses. With a large coil within a charging surface, the coil might emit stray electromagnetic field over the entire charging surface. Stray electromagnetic fields can interact with metal within remote device(s) placed on the charging surface, as well as other metal objects that might be placed within sufficient proximity to the wireless power supply. For example, stray electromagnetic fields may cause metal within the remote device to heat, thereby heating the remote device. As another example, stray electromagnetic fields can heat keys, coins, or other metal object placed in proximity to the wireless power supply. To provide some limit on the impact of stray electromagnetic fields, the power supply and/or remote device may have additional magnetic flux guiding materials that are capable of directing the shape of the electromagnetic field. These materials can be arranged to help limit the field from impacting metals within and without the remote devices. As an example, a flux guiding material may be placed between a coil and a battery, or printed circuit board, to reduce/eliminate the impact of the magnetic field on the battery or printed circuit board.

Another conventional option for providing increased spatial freedom is through the use of inductive coils that move behind, under, or above the charging surface to self-align with the portable device. In these solutions, the coils may move automatically by magnetic attraction, or by motorized mechanism, or by manual adjustment or mechanism. These types of system may include relatively complex mechanical and/or electro-mechanical systems that can significantly increase cost and create reliability issues. For example, mechanical assemblies involve moving parts tend to be more likely to fail than purely electronic systems. Systems based on magnetic attraction may have a limited range of movement that will vary with the strength of the attractor magnet and the amount of force required to move the primary. In addition to cost and reliability issues, motorized systems require time for the primary to be moved into the appropriate position. Manually adjusted systems require human intervention and therefore may not be as convenient as they would be if the remote device could be placed randomly within a large zone and forgotten.

In other conventional systems, positional freedom is achieved through the use of arrays of coils behind, under, or above a charging surface. These arrays may include fixed, discrete charging locations, such as a charging pad with two or more primary coils arranged to allow multiple devices to charge side by side. In other embodiments of an array, there may be multiple layers of coils that overlap in a way that allows for less discrete positioning of the secondary device on the charger. Array-type systems require multiple coils and therefore can be more expensive to implement. They may also involve relatively complex controls, such as additional electronic hardware, for determining which coil(s) in the array to energize and for selectively switching the coils to the proper configuration to provide power to the remote device.

The need to meet the ever increasing consumers demand for convenient portable devices is a strong driving force to exploring the potentials of closely coupled inductive power transfer. The basic concepts of this technology have been described in detail in various publications. However, it is believed that inadequate discussion has been directed toward the issue of precise delivery of the magnetic flux for inductive power transfer, as is the case in most transmission pads. Some of the issues can be described as those of spatial freedom (that is, being able to receive power at different locations on a power transfer surface or transmitting pad), and of electromagnetic field broadcast (that is, ensuring magnetic flux is substantially limited to the flux receiving system and does not significantly transfer into the environment). These are areas of some importance to the technology, given the challenges of interference, parasitic heating and regulatory emission limits.

This problem of electromagnetic field broadcast has traditionally been addressed using power electronics to shut down transmission during non-active periods, but even this technique has residual power being broadcast due to the presence of the communication circuits. Furthermore, such a technique including single-coil transmission systems is generally only applicable to small surface area transmission pads, which do not power multiple devices at the same time. In the case of wide surface area charging systems (delivery of power to multiple remote devices), the field broadcast challenges have gone largely undiscussed in literature that addresses multiple receiver transmission. This is because shutting down the circuit at a particular location due to the removal of one remote device will deprive another remote device of power. Conversely, if the electronic algorithm doesn't include shutdown of the system at one location when one or multiple devices are being charged, then a case of magnetic field broadcast into the surroundings can occur, with its adverse effects.

SUMMARY OF THE INVENTION

The present invention provides a selectively controllable electromagnetic shield. In one embodiment, the present invention provides an electromagnetic shield and a mechanism for selectively generating an aperture in the shield. The mechanism for selectively generating an aperture in the shield may be a magnetic field source that generates a magnetic field of sufficient strength to substantially saturate all or a portion of the shield, thereby essentially temporarily removing its shielding properties. For example, a permanent magnet or DC electromagnet may be used to selectively saturate the shield. In its un-saturated state, the magnetic shield has a high permeability so that it draws the electromagnetic field into itself and functions as a flux path for the magnetic field. In effect, the shield directs the flow of much of the magnetic field through the shield so that the amount of the field passing from one side of the shield to the other is dramatically reduced. Once saturated (in the presence of an external magnetic field), the permeability of the shield is substantially reduced so that the magnetic field lines are no longer drawn into the shield to the same degree. As a result, once saturated, the effectiveness of the shield in the saturated region is reduced and a substantially greater amount of the electromagnetic field may flow through or around the shield in the region saturated by the magnet.

In one embodiment, localized saturation may be used to provide regionalized apertures in the shield. For example, it may be beneficial to saturate only a portion of the shield when it is desirable for the electromagnetic field to penetrate largely within the select regions.

The present invention may be incorporated into a wireless power system to enable a wireless power supply to transmit power to a remote device through a shielding material. A layer of shielding material may be disposed between the primary and the secondary to guide the magnetic field produced by the primary. When not saturated, the shield draws much of the magnetic field into itself providing a path for the field lines to return to the primary. The shielding material may be selectively saturated by applying a magnetic field to the material or to a region of the material to change the permeability of the material so that the field lines are no longer held within the shielding material in the saturated region. Instead, the magnetic field is largely free to flow from the wireless power supply to the remote device in the saturated region.

In one embodiment, the remote device includes one or more magnets, such as permanent magnets, that, when placed on the charging surface of the wireless power supply, saturate the shielding material proximate to the magnet(s) to create an aperture to allow the magnetic field to pass through the shielding material to the remote device. The magnet(s) may be selected and positioned within the remote device to open an aperture of the proper size and location to allow the magnetic field to pass to secondary of the remote device, while continuing to limit stray fields in other regions of the shield. For example, the number, size, shape and material properties of the magnet(s) may be selected to control the characteristics of the aperture. In one embodiment, there are one or more permanent magnets of sufficient strength to saturate the shielding material. In another embodiment, the magnet is one or more DC electromagnets that can be selectively turned on to selectively saturate the shield material when desired.

In one embodiment, the wireless power supply includes one or more electromagnets that can be selectively engaged to produce aperture(s) in the shielding when desired. In one embodiment, the one or more electromagnets are DC electromagnets. The wireless power supply may have circuitry for determining when and where a remote device (or remote devices) is placed on the charging surface. It may also include circuitry for activating the appropriate DC electromagnet(s) to allow the magnetic field to efficiently couple with one or more remote devices while largely containing the electromagnetic field in other regions of the charging surface. For example, the wireless power supply may engage one or more DC electromagnets adjacent to the location of a remote device placed on the charging surface to open an aperture through the shield only at the location of the remote device.

In one embodiment, the selectively controllable magnetic shield may be used in combination with supplemental shielding. In one embodiment, the wireless power supply includes a supplemental shield disposed adjacent the primary opposite the charging surface. The supplemental shield may, for example, help to limit the flow of the magnetic field to the electronics of the wireless power supply and to lossy materials outside the wireless power supply. The supplemental shield may be configured so that it is not saturated by the magnetic field used to open an aperture in the selectively controllable magnetic shield. This configuration may be achieved by material selection, material thickness, geometric placement of the shield within the assembly, and other factors. As a result, the supplemental shield may continue to be an effective shield even when an aperture has been opened.

Similarly, the remote device may include a supplemental shield, which may be disposed between the secondary and the electronics of the remote device. The supplemental shield may help to limit flow of the magnetic field to the electronics of the remote device and to elements outside the remote device. The supplemental shield of the remote device may be configured so that it is not saturated by the magnetic field used to open an aperture in the selectively controllable magnetic shield. This configuration may be achieved by material selection, material thickness, geometric placement of the shield within the assembly, and other factors. As a result, the supplemental shield of the remote device may continue to be an effective shield even when an aperture has been opened.

In one embodiment, the wireless power supply includes a large oval coil that is covered by a magnetic shield. In this embodiment, one or more remote devices can be placed at essentially any location along the oval coil and the shield can be saturated at those select locations to allow the magnetic field generated by the primary coil to more readily penetrate the shield to couple with the secondary coils in the remote devices. For example, each remote device may carry a magnet, such as a permanent magnet, of sufficient strength to saturate an appropriate region of the magnetic shield. As another example, the wireless power supply may include a plurality of electromagnets, for example DC electromagnets, arranged along the length of the primary coil. The appropriate electromagnet(s) may be activated to open an aperture in the shield adjacent the remote device(s) while the non-saturated regions of the shield can continue to largely contain the flow of the magnetic field.

In one embodiment, the wireless power supply includes an array of primary coils that are covered by a magnetic shield. In this embodiment, one or more remote devices can be placed at essentially any location over the array of coils. The wireless power supply may power all of the coils simultaneously or it may be configured to power only that coil (or those coils) that are adjacent to a remote device placed over the array. The shield can be saturated adjacent to each remote device to allow the magnetic field generated by the underlying primary coil(s) to efficiently couple with the secondary coil in the remote device. For example, each remote device may carry a magnet, for example a permanent magnet, of sufficient strength to saturate a region of the shield. As another example, the wireless power supply may include a plurality of electromagnets, such as DC electromagnets, arranged within or adjacent to the array of primary coils (e.g. one or more electromagnets associated with each coil). The appropriate electromagnet(s) may be activated to open an aperture(s) in the shield adjacent the remote device(s).

The present invention can be used in a wide variety of applications, including applications that relate to transmitting electromagnetic fields, such as wireless power and wireless communications, to consumer electronics devices, computers, headsets, electric appliances, electric tools, vehicles (e.g. passenger, commercial and military vehicles) and military devices. In the context of wireless power transfer, the present invention can be used to provide a large charging surface with a wide range of positional freedom for placing a remote device during power transfer/charging. For example, the selectively controllable shielding can be use to focus and control magnetic field transmission, such as inductive wireless power transfer, over a broad surface. By having a selective magnetic aperture in a charger surface a single, larger primary coil can be used to transmit to one or multiple secondary coils while limiting parasitic losses. Embodiments that incorporate localized saturation will largely contain the magnetic field except where intended (e.g. regions where the shield has been adequately saturated). One benefit of embodiments that incorporate localized saturation is that they allows lossy items placed on the charging surface away from the aperture to not materially impact parasitic losses as they would typically with standard pads or field areas. In embodiments that combine selectively controllable shielding with supplemental shielding, the present invention provides the ability to fully shield a device (or a portion of a device) while at the same time allowing a window in the shield to be selectively opened when and where it is desirable to allow magnetic field penetration. As can be appreciated, in some embodiments, the present invention may provide a mechanism in which two of the primary concerns—spatial freedom and magnetic field broadcast—can be handled and controlled while transferring power efficiently, by the use of selective saturation of the shield (e.g. a magnetic ferrite flux-guide) to allow power transmission substantially only at the particular location(s) (e.g. a region on a transmitter pad) where it is needed by a receiver (e.g. a secondary coil). The shield can act both as a flux shield by protecting excess flux from being broadcast into the surroundings, but also as a flux guide to limit flux leakage and increase power transfer efficiency.

These and other objects, advantages and features of the invention will be more fully understood and appreciated by reference to the description of the current embodiment and the drawings.

Before embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

BRIEF DESCRIPTION OF THE DRAWINGS

FIG. 10 is a representation of effect that the permanent magnet in the portable device has on the intermediate shield, allowing the magnetic flux lines created by the primary coil to pass through.

FIG. 12 is a graph showing magnetization curves for various ferromagnetic materials.

FIG. 13 is an exemplary graph showing changes in flux density in response to variations in magnetizing force for a material.

FIG. 15 shows a table of materials that were considered in one set of lab tests for the intermediate shield.

FIGS. 17A-F shows test data describing the regionalized transfer of power through the aperture opened by the permanent magnet(s).

FIGS. 18A-B are summaries of power transfer and efficiency, comparing an open aperture to a closed surface.

FIGS. 30A-B are representational views of a wireless power supply.

DESCRIPTION OF CURRENT EMBODIMENTS

Figure 1:
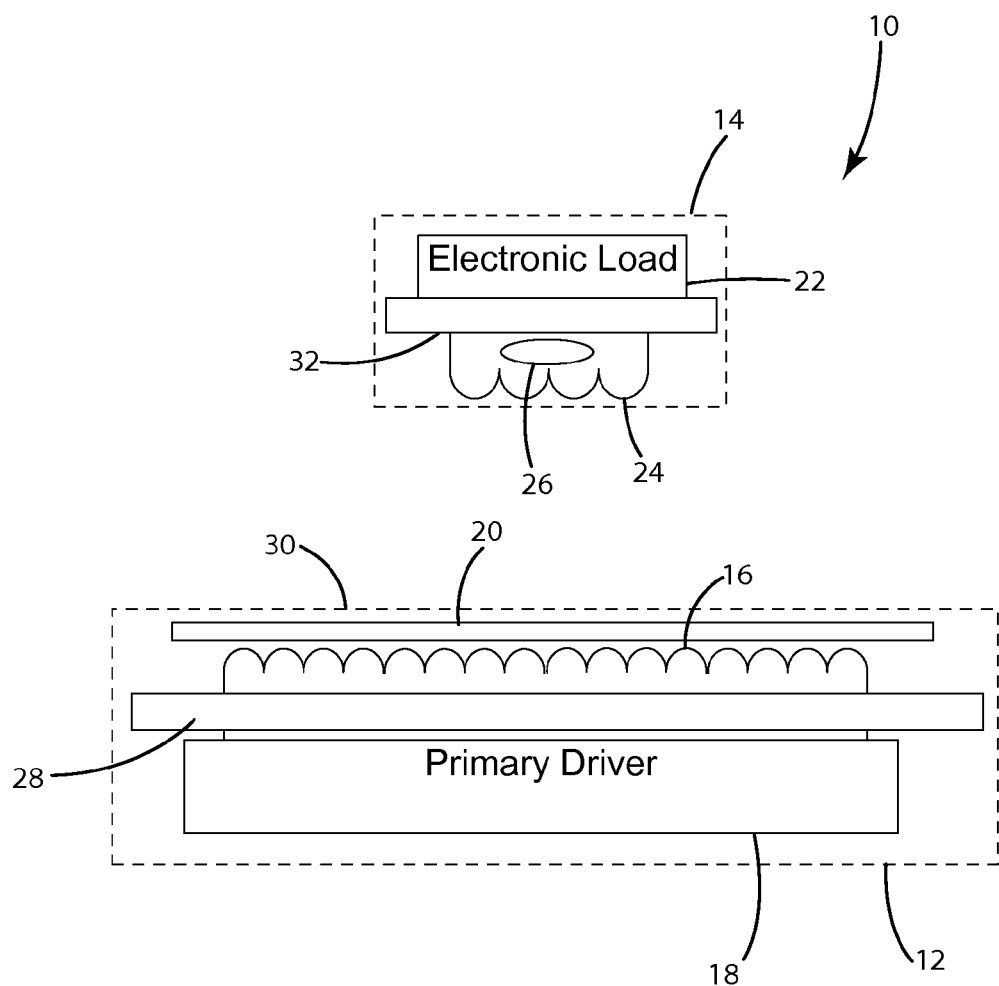
FIG. 1 is a block diagram of a wireless power supply system in accordance with an embodiment of the present invention.

A wireless power supply system incorporating an embodiment of the present invention is shown in FIG. 1. The wireless power supply system 10 generally includes a wireless power supply 12 and a remote device 14. The wireless power supply 12 of this embodiment includes a primary coil 16, a primary driver 18 and an intermediate magnetic shield 20. In use, the primary driver 18 applies an alternating signal to the primary coil 16 to produce a magnetic field. The remote device 14 of this embodiment includes an electronic load 22, a secondary coil 24 and a permanent magnet 26. When in the presence of an appropriate magnetic field, a current is induced in the secondary coil 24 to provide power for the electronic load 22. The induced power may be used to charge the remote device 14 and/or to directly power the remote device 14. The illustrated intermediate shield 20 is a magnetic shield that can be selectively saturated by a magnetic field to provide an aperture in the shield. In a non-saturated state, the intermediate shield 20 has a high permeability and therefore draws much of the magnetic field into itself providing a path for the field lines. In this state, the intermediate shield 20 dramatically reduces the amount of magnetic field that passes through the intermediate shield 20 where it might reach the remote device 14 or constitute stray magnetic field. When saturated, the affected region of the shield 20 will have substantially reduced permeability and therefore will draw significantly less of the electromagnetic field lines into itself. This permits the magnetic field to largely pass through or from the magnetic shield in the saturated region to efficiently couple with the remote device. As a result, the present invention provides an intermediate shield that, in the context of wireless power transfer, can, among other things, be used to limit stray magnetic fields and reduce losses by selectively limiting the effectiveness of the shield only in regions where it is desirable for the magnetic field to flow to the remote device.

For purposes of disclosure, the present invention is described primarily in the context of specific wireless power supplies and specific remote devices. The present invention is not, however, limited to use with wireless power supply systems—let alone the specific wireless power supplies and remote devices described herein. Rather, the present invention may be incorporated into essentially any application that might benefit from selectively controllable magnetic shielding.

Directional terms, such as "top," "bottom," "upper," "lower," "above," "below," "inner," "inwardly," "outer" and "outwardly," are used to assist in describing the invention based on the orientation of the embodiments shown in the illustrations. The use of directional terms is intended to facilitate disclosure and should not be interpreted to limit the invention to the illustrated orientation(s).

Figure 7:
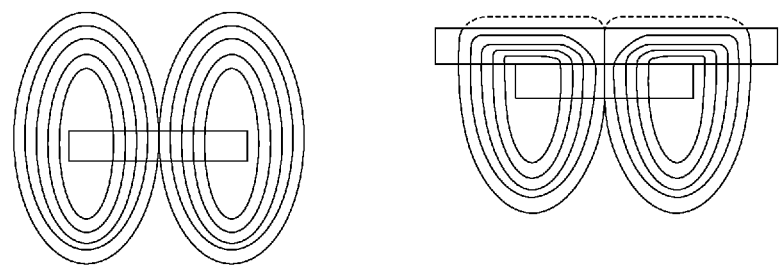
FIG. 7 is a general representation providing a comparison of magnetic fields in the absence and presence of a magnetic shield.

The present invention involves the use of electromagnetic shielding (sometimes referred to as simply "magnetic" shielding). FIG. 7 shows how magnetic shielding may be used to provide a flow path for the field lines of a magnetic field. The left drawing provides a general representation of the shape of the field lines around a coil through which electricity is flowing to generate a magnetic field. The right drawing includes a similar representation that includes a magnetic shield over the coil. This drawing provides a representation of how the magnetic shield draws the field lines into itself and functions as a guide for much of the magnetic flux. This drawing also shows that not all field lines will be contained within the shielding material. By providing a flow path for the flux, the shield can dramatically reduce the amount of the magnetic field that passes into the region above the shield.

Some materials that have proven suitable for use as magnetic shielding in the present invention include certain soft magnetic materials. Soft magnetic materials are those which can be magnetized but don't tend to stay magnetized without the presence of an external magnetic field. These materials are composed of microscopic regions called magnetic domains that act like tiny permanent magnets. Before an external magnetic field is applied to the material, the domains are oriented in random directions. Their tiny magnetic fields point in random directions and cancel each other out, so the material has no overall net magnetic field. When an external magnetizing field H is applied to the material, it penetrates the material and aligns the domains, causing their tiny magnetic fields to turn and align parallel to the external field, adding together to create a large magnetic field which extends out from the material. This is called magnetization. The stronger the external magnetic field, the more the domains align. Saturation occurs when a sufficiently large number of the domains are lined up that further increases in applied field don't cause a significant amount of further alignment of the domains. This discussion presents a simplified account; a more complete explanation can be found in ferromagnetic textbooks and elsewhere.

A good magnetic core material (e.g. a material intended to provide a path for magnetic flux) should have high permeability. The effective permeability of a material typically varies with applied magnetic field, reducing as the applied field approaches the saturation flux density. FIG. 12 shows magnetization curves of nine ferromagnetic materials. These curves show the magnetization curves of: 1. Sheet steel, 2. Silicon steel, 3. Cast steel, 4. Tungsten steel, 5. Magnet steel, 6. Cast iron, 7. Nickel, 8. Cobalt and 9. Magnetite. The curves show the relationship between magnetic field strength (H) and magnetic flux density (B). Accordingly, these curves show the resultant magnetic flux in the material in response to magnetic fields of different strengths. The relationship between magnetic field strength and flux density is generally non-linear and may vary dramatically along the curve. As the increasing magnetic field strength approaches saturation of the material, the curve become increasingly flatter representing that increases in magnetic field strength will result in only limited or no further increase in flux density. The slope of the curve at any given point represents the permeability of the material at that particular magnetic field strength. Values shown in FIG. 12 are approximate and valid only at the magnetic fields shown. Moreover, they are given for a zero frequency; in practice, the permeability is generally a function of the frequency. When frequency is considered the permeability can be complex, corresponding to the in phase and out of phase response. Note that the magnetic constant $\mu 0$ has an exact value in SI units (that is, there is no uncertainty in its value), because the definition of ampere fixes its value to $4\pi \times 10\text{-}7$ H/m exactly. The material believed to have the highest known magnetic permeability is Metglas Magnetic Alloy 2714A (Cobalt-based) (see Curve 9 in FIG. 12) with a high frequency annealed permeability of 1,000,000 (Maximum DC Permeability ($\mu$)). Hydrogen annealed (pure iron—N5 grade) can have a permeability of 160,000 ($\mu$) but is very expensive.

The curves shown in FIG. 12 are somewhat incomplete in that they generally represent the changes in flux density that may occur as the magnetic field strength increases. With most soft magnetic materials, the curve will follow a somewhat different line as magnetic field strength is decreased through the same set of values. This is the result of a phenomenon generally referred to as "magnetic hysteresis." FIG. 13 shows a graph representing the hysteresis curve of a typical soft magnetic material. This graph is similar to FIG. 12 in that it shows magnetizing force along the x-axis and flux density along the y-axis. Regions A and B have been added to FIG. 13 to provide a representation of the affect of adding a magnetizing force to the system. Region A represents the range for a system in which the magnetizing force varies from the left-most edge of region A to the right-most edge of region A. As shown, the slope of the curve (e.g. the permeability of the material) remains high throughout this range. Region B represents the operating range of that same system when it is placed under the influence of an additional magnetizing force. For example, when a permanent magnet of a particular value is positioned to influence the material, it biases the operating range in a direction up the hysteresis curve. If biased to the point where the material approaches saturation (as shown in this illustration), the slope of the curve (e.g. the permeability of the material) becomes relatively flat. The shield is most effective as a flux-guide in the high permeability (no saturation) region of the material characteristic, but with a bias added, the operating point is pushed to an area of low permeability (high saturation) by the summation of the permanent magnet DC field and transmitter AC field. The operating point of the shield due to the transmitter flux is thus moved into the low saturation region (region B). In this embodiment, the material characteristic is such that it has enough coercivity to be able to contain the transmitter generated flux without saturating, but have a knee point acute enough such that the DC threshold flux can move it into a region of high saturation (e.g. region B).

The electromagnetic shield may be manufactured from essentially any material that provides properties consistent with the principles of the present invention. Generally, it is desirable for the shield to have high permeability, low saturation and low electrical conductivity. More specifically, it is desirable for the shielding material to have a substantially higher permeability than free space. Although the specific degree of permeability may vary from application to application, in typically applications, it may be desirable for the shielding material to have a permeability that is ten times the permeability of free space or greater. It is desirable for the shielding material to have a sufficiently low saturation that the material can be adequately saturated when it is desirable to generate an aperture through the material. Although the degree of saturation desired may vary from application to application, it may be desirable to use a shielding material that can be saturated to the point that its permeability approaches that of free space in the presence of the magnetic field used to saturate the shield. It should therefore be understood that the term "saturation" is used herein to refer to substantial saturation and is not intended to be limited to complete saturation. The thickness of the shielding material may also play a role in the amount of magnet field required to saturate the shield. For example, a thinner shield will typically be more easily saturated than a thicker shield. So, it may be desirable to balance the thickness of the shield with other factors. The intermediate shield 20 of the embodiment of FIG. 1 is manufactured from a material that may be selectively saturated by magnetic 26. More specifically, the magnet 26 may substantially saturate all or a portion of the intermediate shield 20 so that its permeability changes to the point that the field lines are no longer largely held within the shielding material. Instead, the electromagnetic field is free to flow through or from the shield in the saturated region to the remote device. It is also desirable for the shielding material to have sufficiently low conductivity that it doesn't unacceptably heat or otherwise result in unacceptable losses during use. For example, a magnetic field may generate eddy currents in conductive materials. The eddy currents generate heat and result in losses. The generation of eddy currents increases with the conductivity of the material making it desirable to use materials of lower conductivity. The amount of heat and other losses that are acceptable may vary from application to application. For example, the acceptable levels may be based on a variety of factors, such as desired efficiency levels, potential impact to surrounding components or even aesthetics. These factors should also be considered in context with the strength of the magnetic field being shielded and the magnetic field that will be used to saturate the shield. In some applications it may be desirable to limit the field strength of the magnet or electromagnet used to saturate the field. For example, in some applications, an excessively strong magnetic field could have a negative affect on nearby materials, such as magnetic storage media and other similar item. The magnet and shielding material should be selected to provide adequate saturation in the presence of the anticipated magnetic field without exceeding any desired limits on magnetic field strength. Some specific materials that have shown to be suitable for use as intermediate shield material include flexible composite ferrite (such as Flexield IRJ09, which is available from TDK Corporation) and pre-fractured ferrite (i.e. a ferrite material that has been broken into multiple pieces, such as Flexield IBF20, which is available from TDK Corporation). FIG. 15 shows the permeability, saturation and conductivity characteristics of several materials tested in the lab. As can be seen, the tested flexible composite ferrite provided the best results in that it was high in initial permeability and low in saturation and conductivity. Of the three tested materials, the bonded iron seemed to have properties least suitable for use as a selectively controllable shield. The bonded iron had relatively low permeability, had a high saturation value and relatively high conductivity. The pre-fractured ferrite might prove to be suitable in some applications in that it was very high in permeability, had a medium saturation flux density and was less conductive than the bonded iron. It should be noted that the magnetic shield of the present invention may sometimes be referred to by names that reflect its ability to function as a flow path for magnetic flux, such as a flux guide, a flux concentrator or a magnetic flux concentrator.

In one embodiment, it may also be possible for the system to vary the level of saturation of the shield to control the amount of power being transferred between the wireless power supply and the remote device. For example, a remote device which requires low levels of power may be set on a wireless power supply capable of providing very high levels of power. In this instance, the remote device may provide a magnetic bias only strong enough to partially saturate the shield, allowing some of the available power through the shield, but not all. In another example, a remote device may use a variable strength electromagnet to change the level of saturation in the shield to control the amount of power it receives from the wireless power supply. By increasing the strength of the electromagnet, the shield saturation level increases, allowing more flux through the surface of the wireless power supply. By decreasing the strength of the electromagnet, the saturation level decreases, resulting in a lower amount of flux passing through the surface of the wireless power supply. In this instance, the remote device may be capable of controlling the amount of power received from the wireless power supply. In this instance, the wireless power supply may not need to receive communications from the remote device since it is no longer controlling the amount of power being transmitted. In one embodiment, a plurality of remote devices may simultaneously receive power from the wireless power supply. The amount of power distributed to each device may be controlled by varying the shield saturation level at each remote device. This may allow remote devices with different power requirements to simultaneously receive power from the wireless power supply. It may also allow remote devices to adjust for differences in the strength of the electromagnetic field at different locations adjacent to the wireless power supply (e.g. different positions on a power transfer surface). For example, the wireless power supply may operate at a power level sufficient to provide power to multiple devices and the individual remote devices may each control the amount of power that it receives. In one embodiment, the remote devices may be placed adjacent the shield at different locations and the amount of power received through the shield by each remote device may be controlled by adjusting the strength of the magnetic field adjacent to each remote device. In one embodiment, each remote device may include a variable strength electromagnet, as well as a control system that determines received power and adjusts the strength of the magnetic field to allow the appropriate amount of power to reach the remove device. In operation, each individual remote device may increase the strength of its associated magnetic field until it is determined that the remote device is receiving the desired amount of power. For example, each remote device may include a current sensor, a voltage sensor or other sensor capable of providing to the control system a signal indicative of the level of power being received by the remote device. In applications in which the load of the remote device may vary, it may be desirable to include both a current sensor and a voltage sensor from which received power can be determined. In applications in which the load characteristics of the remote device are sufficiently known, it may be desirable to include a current sensor or a voltage sensor from which received power can be determined based on the sensed characteristic and the expected load characteristics. The control system may control the strength of the magnetic field through essentially any circuitry or components capable of varying the power supplied to the electromagnet. For example, the electromagnet may receive power from a controlled current source. The controlled current source may have an output level that is controlled by the control system. More specifically, the control system may adjust the output level of the controlled current source based on a comparison of the received power with the desired power—increasing the current to increase saturation when the received power is low and decreasing the current to decrease saturation when the received power is high. The variable strength magnetic field sources and associated control system may or may not be contained within the remote device. However, when the variable strength electromagnet and associated control system are included with the remote device, it is possible to have the described level of power control without the need for the remote device to communicate with the wireless power supply. This is not to say that communications may not be desirable to provide supplemental control or for other purposes. For example, it may be desirable to provide communications to allow the wireless power supply to provide an appropriate amount of power to power all of the remote devices requiring power. In one embodiment, each remote device may include a communication circuit to communicate its power requirements to the wireless power supply and the wireless power supply may include a communication circuit to receive the power requirements. The wireless power supply may include a power output controller that uses the power requirements to determine the total amount of power to be transmitted by the wireless power supply. In the simplest embodiments, the wireless power supply may simply sum the individual power requirements to determine its power output. As another example, the system may include communications to allow a remote device to advise the wireless power system to increase its power output when that remote device is not receiving sufficient power even when its magnetic field is at full strength. In both of the foregoing examples, communications may assist in improving efficiency while still allowing each remote device to have primary control over the amount of power received from the wireless power supply. In some embodiments, it may be desirable to include both of the preceding communications capabilities. This could allow the wireless power supply to set an appropriate initial power output level and to adjust the power output level over time, if necessary, to meet the power requirements of all of the remote devices. To avoid uncertainty, it should be noted that variable strength magnetic field sources may be used with wireless power supplies that include a single primary (e.g. a single primary coil) or a plurality of primaries (e.g. an array of primary coils). The wireless power supply may vary its power output level using essentially any suitable circuit or components. For example, the wireless power supply may include a power output controller configured to vary the rail voltage, duty cycle, operating frequency or phase of the input signal applied to the primary circuit, or it may vary the resonant frequency of the primary circuit when the wireless power supply includes a resonant primary circuit.

As can be seen, in one embodiment, the present invention can provide increased spatial freedom in inductive powering systems by making use of the highly non-linear properties of a soft magnetic material used as an electromagnetic shield (e.g. wireless power transmitter pad flux-guide). This nonlinearity is such that the material can be quickly switched from a region of high permeability ($\mu \gg 1$) and hence a good flux guide, into a region of high saturation ($\mu \approx 1$) with permeability as that of air, allowing the flux to penetrate past it to the receiver, by use of a calculated bias DC threshold field.

As discussed in more detail below, this DC threshold field can be achieved by incorporating a DC magnet or an array of DC magnets into the receiver system. This array provides a bias magnetic field, thus changing the operating point of the magnetic characteristics of the flux shield (e.g. the transmitter pad flux-guide), wherever the receiver is placed on the transmitter pad surface. Therefore, depending on where the receiver system is placed, the soft ferrite can either be a flux guide or a highly saturated region with permeability close to that of air. As a flux guide, it substantially reduces magnetic field broadcast and as a highly saturated region with permeability close to that of air it can allows a substantially greater portion of the transmitter generated AC magnetic field through to the receiver system, where it induces a voltage and hence transfers power.

As noted above, a wireless power supply system incorporating an embodiment of the present invention is shown in FIGS. 1-6, 8 and 10. The system 10 includes a wireless power supply 12 that is configured to wirelessly provide power to a remote device 14. The wireless power supply 12 of this embodiment has a charging surface 30 upon which the remote device 14 may be placed to receive power from the wireless power supply 12. The wireless power supply 12 is configured to generate a magnetic field that can be coupled with the remote device 14 when it is placed on the charging surface 30 to wirelessly produce power in the remote device 14. More specifically, the wireless power supply 12 of this embodiment includes a primary driver 18 that is operable to apply an oscillating signal to the primary coil 16. The oscillating signal causes the primary coil 16 to generate a magnetic field capable of inducing current in a properly configured remote device 14 disposed on the charging surface 30. The wireless power supply 12 may be configured to receive an AC mains input and convert it into the appropriate signal from the primary coil 16. To that end, the wireless power supply 12 may include power supply circuitry, such as a rectifier (not shown) and a DC-DC converter (not shown). The rectifier and DC-DC converter provide the appropriate DC power for the oscillating signal applied to the primary coil 16 by the primary driver 18. The power supply circuitry may alternatively be essentially any circuitry capable of transforming the input power to the form used by the primary driver. The wireless power supply 12 may be configured to provide power to a specific type of remote device or it may be capable of providing power to a variety of different remote devices. Further, the wireless power supply 12 may be designed to provide power to only one remote device at a time or it may have the ability to provide power to multiple devices simultaneously.

Figure 2:
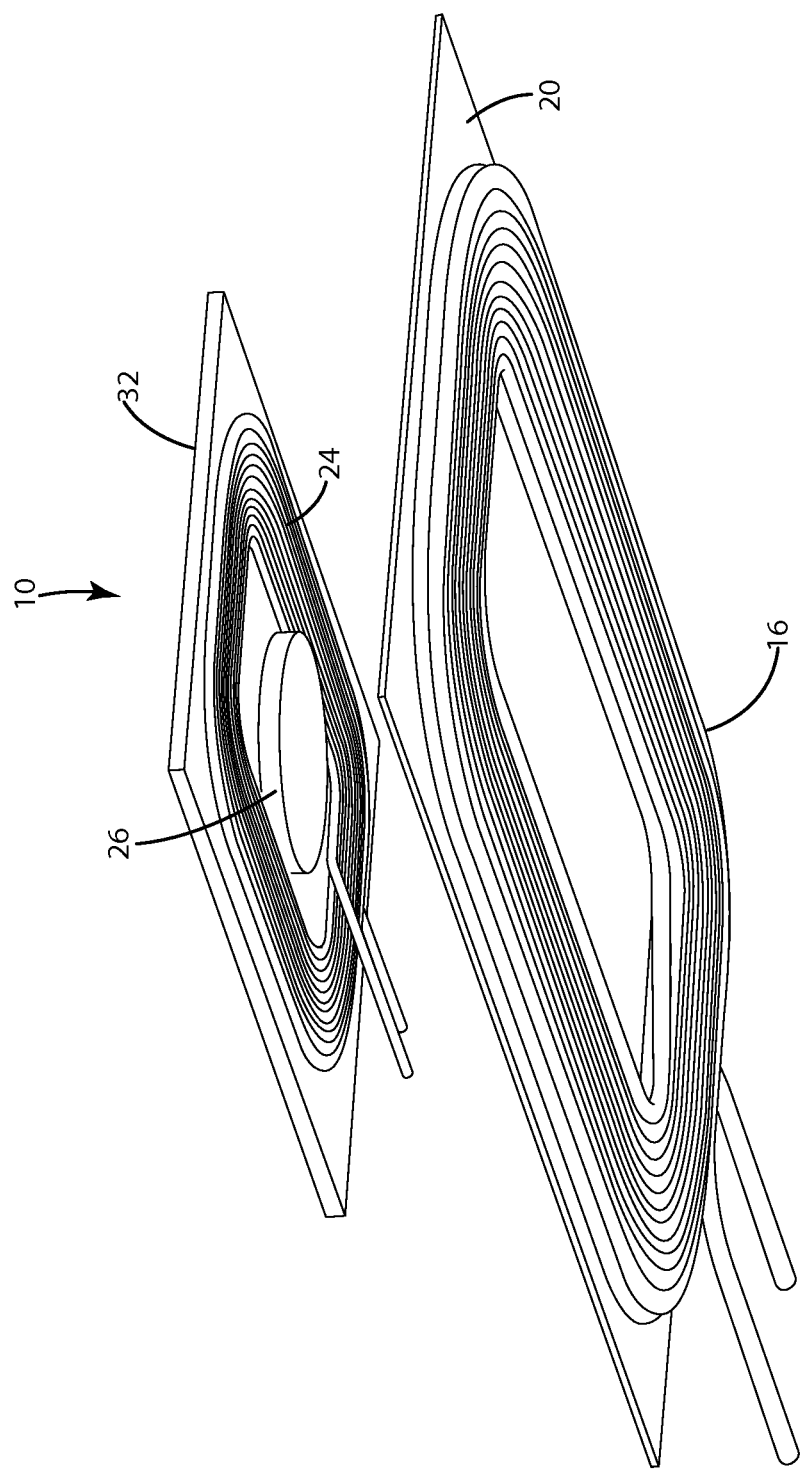
FIG. 2 is a bottom perspective view of a portion of the wireless power supply system of FIG. 1.

As perhaps best shown in FIG. 2, the primary coil 16 of the illustrated embodiment is a coil of wire. In this particular embodiment, the primary coil 16 is a two-layer spiral wound coil of Litz wire. The wireless power supply 12 may, however, include essentially any inductor capable of generating a magnetic field suitable for wirelessly transferring power to the remote device 14. The configuration of the primary coil 16 may vary from application to application. For example, the size of the coil (e.g. inner diameter, outer diameter and thickness), the shape of the coil, the type wire, the arrangement of the turns, the number of turns and the spacing between adjacent turns may all vary from application to application as desired.

Although the upper surface of the wireless power supply 12 is referred to as a "charging surface," the term should not be interpreted to limit the wireless power supply system 10 to applications in which the wireless power is used to charge a remote device. Rather, the power transferred by the wireless power supply 12 can be used to directly power the remote device and/or to charge an electric charge storage device (e.g. battery, capacitor, supercapacitor) located within the remote device. Further, in some applications, the magnetic field transferred from the wireless power supply to the remote device may be a communication signal rather than a power signal.

The wireless power supply 12 includes an intermediate shield 20 disposed adjacent to the primary coil 16 in a location between the primary coil 16 and the charging surface 30. In general use, the intermediate shield 20 functions as a flow path that guides much of the magnetic field and returns it to the primary coil 16, thereby largely preventing the magnetic field from reaching the secondary coil 24 in the remote device 14. The intermediate shield 20 is manufactured from a material that can be selectively saturated. When saturated, the ability of the intermediate shield 20 to function as a flow path for the magnetic shield in the saturated region is dramatically limited. As a result, the magnetic field is more readily able flow through and from the magnetic shield 20 in the saturated region. When properly configured, this permits the magnetic field to sufficiently couple with the secondary coil 24 to efficiently transfer power to the remote device 14. As discussed above, the intermediate shield 20 may be manufactured from essentially any material that has appropriate permeability, saturation and conductivity properties. For example, the intermediate shield 20 may be manufactured from certain soft magnetic material, such as a flexible composite ferrite (e.g. Flexield IRJ09) or a pre-fractured ferrite.

The wireless power supply 12 of this embodiment includes a supplemental shield 28 that is disposed adjacent the primary coil 16 opposite the intermediate shield 20. The supplemental shield 28 of the illustrated embodiment is configured so that it will not become saturated by the magnetic field used to saturate the intermediate shield 20. As a result, the supplemental shield 28 continues to function as an effective shield even when an aperture is open in the intermediate shield 20. To avoid saturation, the supplemental shield 28 may be manufactured from a different material than the intermediate shield 20 (e.g. a material with a higher saturation point) and/or it may be thicker than the intermediate shield 20. For example, the supplemental shield 28 may be manufactured from pressed iron. In some applications, the supplemental shield 28 may avoid saturation simply because it is more distant from the magnetic field source.

The remote device 14 of this embodiment generally includes an electronic load 22, a secondary coil 24 and a permanent magnet 26. The remote device 14 may be a generally conventional electronic device, such as a cell phone, a personal digital assistant, a media player, a handheld radio, a camera, a flashlight or essentially any other battery-powered portable device. The components associated with the principle operation of the remote device 14 (and not associated with wireless power transfer) are generally referred to as electronic load 22. The electronic load 22 is not described in detail. For example, in the context of a cell phone, no effort is made to describe the electronic components associated with the cell phone itself.

The secondary coil 24 of the illustrated embodiment is a coil of wire, but the remote device 14 may include essentially any inductor capable of generating sufficient electrical power in response to the varying magnetic field generated by the wireless power supply 12. The secondary coil 24 may vary in configuration from application to application. For example, the size of the coil (e.g. inner diameter, outer diameter and thickness), the shape of the coil, the type wire, the arrangement of the turns, the number of turns and the spacing between adjacent turns may all vary from application to application as desired.

Although not shown, the remote device 14 may include circuitry for converting the power induced in the secondary coil 24 into the appropriate form for the electronic load 22. For example, the remote device 14 may include a rectifier (not shown) that converts the AC power induced in the secondary coil 24 into DC power. The remote device 14 may also include a DC-DC converter (not shown) in those embodiments where conversion is desired.

In the illustrated embodiment, the permanent magnet 26 is disposed within and carried by the remote device 14. More specifically, the illustrated magnet 26 is concentric with and disposed in roughly the same plane as the secondary coil 24. The position of the magnet 26 may, however, vary from application to application. In the illustrated embodiment, the remote device 14 includes a single bonded NdFeB magnet (also known as a neodymium, NIB, rare earth, or Neo magnet). The magnet, however, may vary from application to application. For example, the magnet may alternatively be a ferrite magnet, a sintered NdFeB magnet, a sintered SmCo magnet, or an Alnico magnet. The magnet 26 is selected to have sufficient magnetic field strength to substantially saturate the intermediate shield 20 when the remote device 14 is placed on the charging surface 30. The magnet 26 may also be configured to provide an aperture (or region of saturation) that is of sufficient size and shape to allow the magnetic field to adequately couple with the secondary coil 24 while at the same time being as small as possible to reduce the potential for stray magnetic fields. The intermediate shield 20 and magnet 26 are configured so that the magnet 26 can selectively saturate the intermediate shield 20. More specifically, the properties/characteristics of the intermediate shield 20 and the magnet 26 are selected so that the magnetic field produced by the magnet 26 is sufficient to substantially saturate the intermediate shield (or the desired portion of the intermediate shield 20) when the remote device 14 is placed on the charging surface 30. The illustrated magnet 26 is a disc-shaped magnet, but the shape of the magnet may vary depending on the desired aperture. For example, the magnet may be rectangular or may be ring magnet.

The remote device 14 may include a supplemental shield 32. In the illustrated embodiment, the remote device supplemental shield 32 is disposed adjacent the secondary coil 24 opposite the charging surface 30. The remote device supplemental shield 32 of the illustrated embodiment is configured so that it is not saturated by the magnetic field used to saturate the intermediate shield 20. As a result, the remote device supplemental shield 32 continues to function as an effective shield even when an aperture is open in the intermediate shield 20. As with the primary supplemental shield 28, the remote device supplemental shield 32 may be manufactured from a different material than the intermediate shield 20 (e.g. a material with a higher saturation point) or it may be thicker than the intermediate shield 20. For example, the remote device supplemental shield 32 may be manufactured from pressed iron. In some applications, the remote device supplemental shield 32 may avoid saturation simply because it is more distant from the magnetic field source. In use, the wireless power supply supplemental shield 28 and the remote device supplemental shield 32 cooperate to largely contain the magnetic field produced by the primary coil 16.

Figure 3:
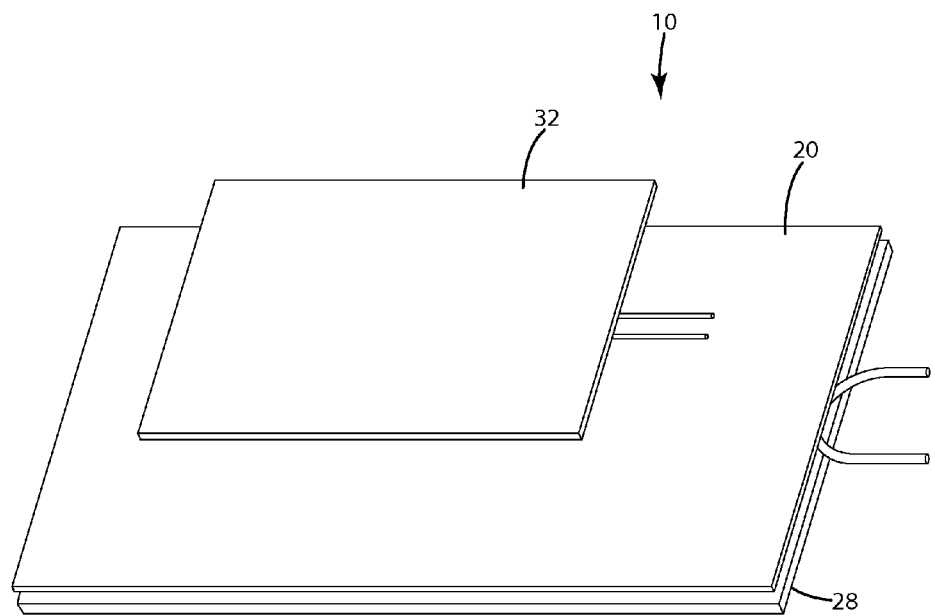
FIG. 3 is a top perspective view of a portion of the wireless power supply system of FIG. 1.
Figure 4:
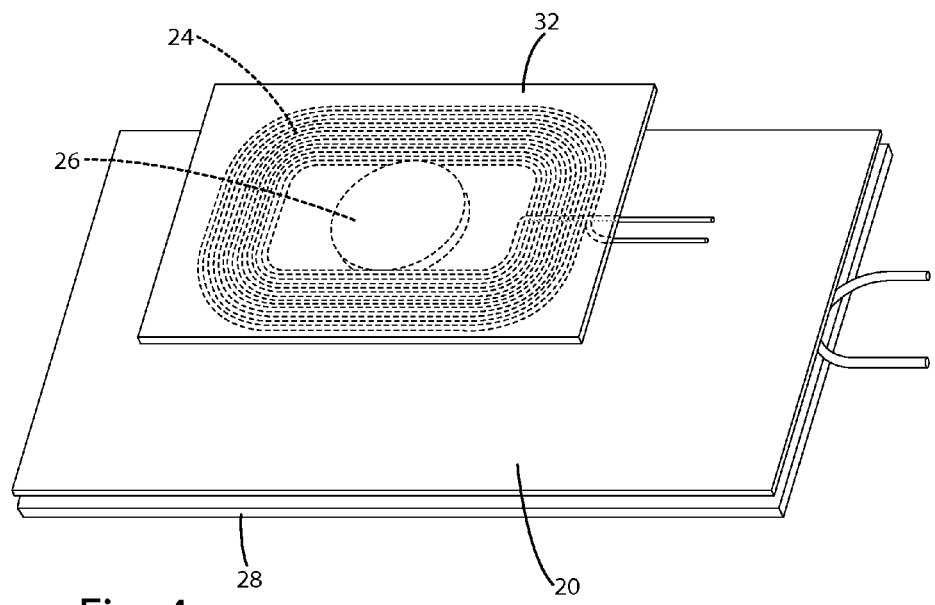
FIG. 4 is a top perspective view of a portion of the wireless power supply system of FIG. 1 with the hidden secondary components highlighted.
Figure 5:
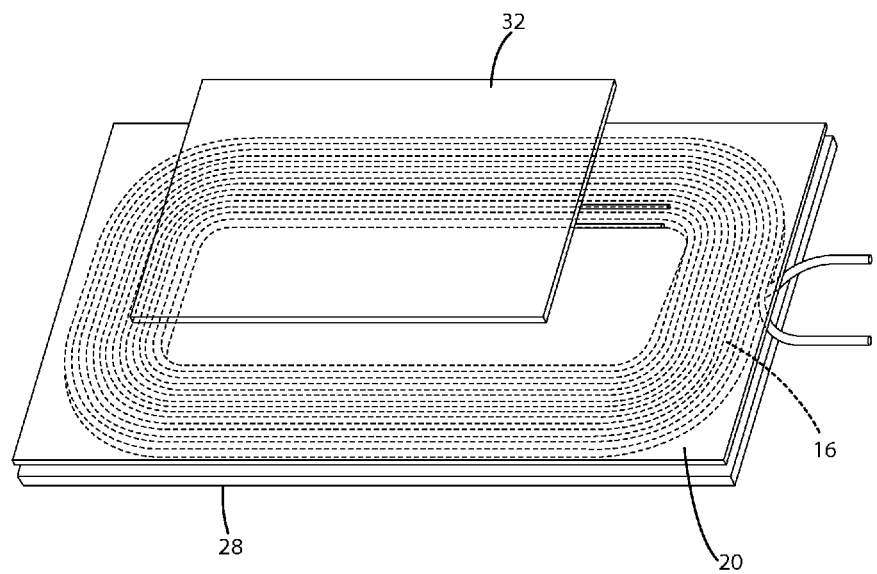
FIG. 5 is a top perspective view of a portion of the wireless power supply system of FIG. 1 with the hidden primary coil highlighted.
Figure 6:
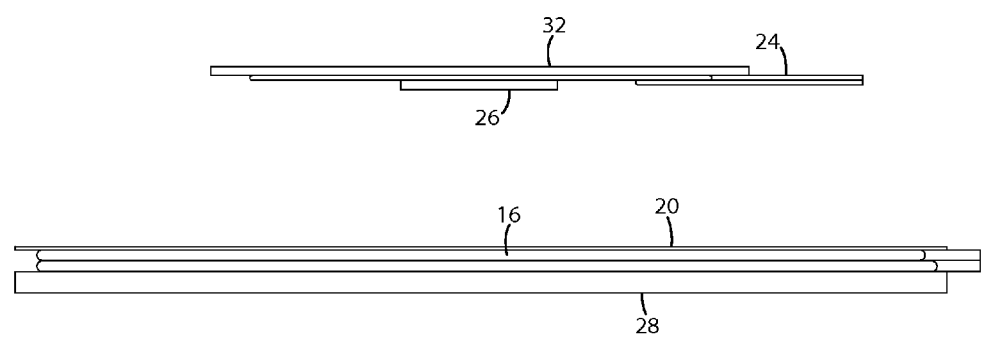
FIG. 6 is a side view of a portion of the wireless power supply system of FIG. 1.

FIGS. 3-6 are further illustrations of the embodiment shown in FIGS. 1-2. FIG. 3 shows portions of the remote device 14 positioned over portions of the wireless power supply 12. More specifically, FIG. 3 shows the secondary coil 24 and remote device supplemental shield 32 disposed over the intermediate shield 20, the primary coil 16 and the primary supplemental shield 28. FIG. 4 is essentially identical to FIG. 3, except that the hidden secondary coil 24 is made visible through the remote device supplemental shield 32. FIG. 5 is also essentially identical to FIG. 3, except that the primary coil 16 is made visible through the intermediate shield 20, the secondary coil 24 and the remote device supplemental shield 32. It should be noted that FIGS. 3-5 do not show the charging surface 30. In some applications, a separate charging surface 30 may be disposed over the intermediate shield 20. In other applications, the intermediate shield may be charging surface and remote devices may be placed directly on the intermediate shield. FIG. 6 is a side elevational view of the secondary coil 24, magnet 26 and remote device supplemental shield 32 disposed over the intermediate shield 20, the primary coil 16 and the primary supplemental shield 28. The remaining portions of the wireless power supply 12 and the remote device 14 are not shown in FIGS. 3-6.

Figure 8:
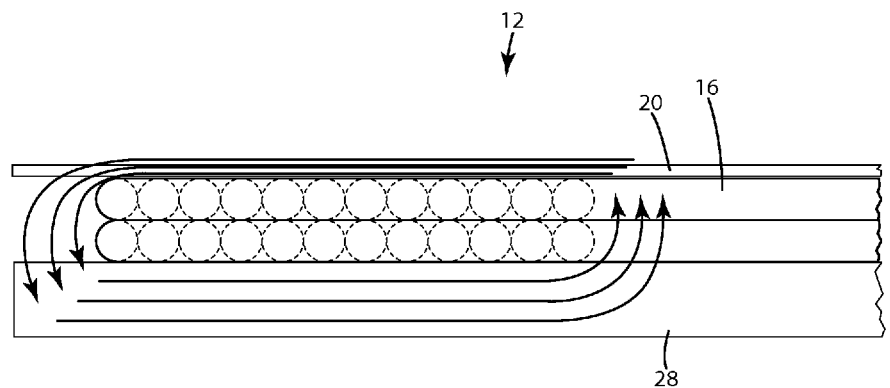
FIG. 8 is a representational view showing the effect that the primary supplemental flux concentrator and the intermediate shield have on the magnetic flux lines created by the primary coil.
Figure 9:
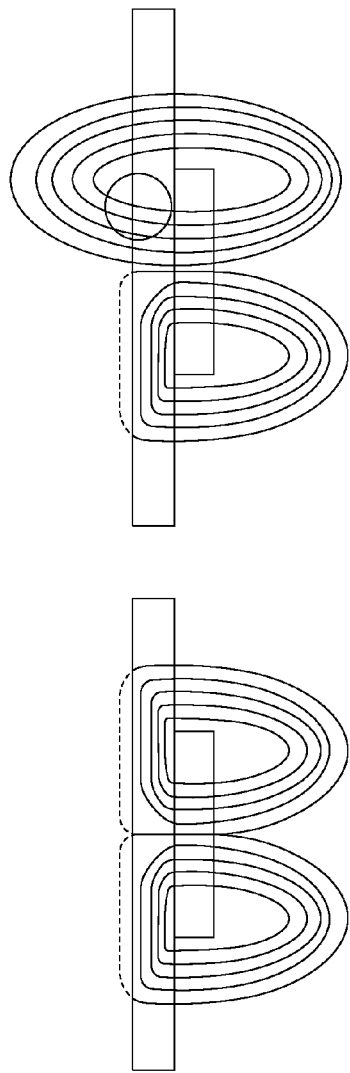
FIG. 9 is a general representation similar to FIG. 7 providing a comparison of magnetic fields with respect to a non-saturated magnetic shield and a magnetic shield with a saturated region.
Figure 10:
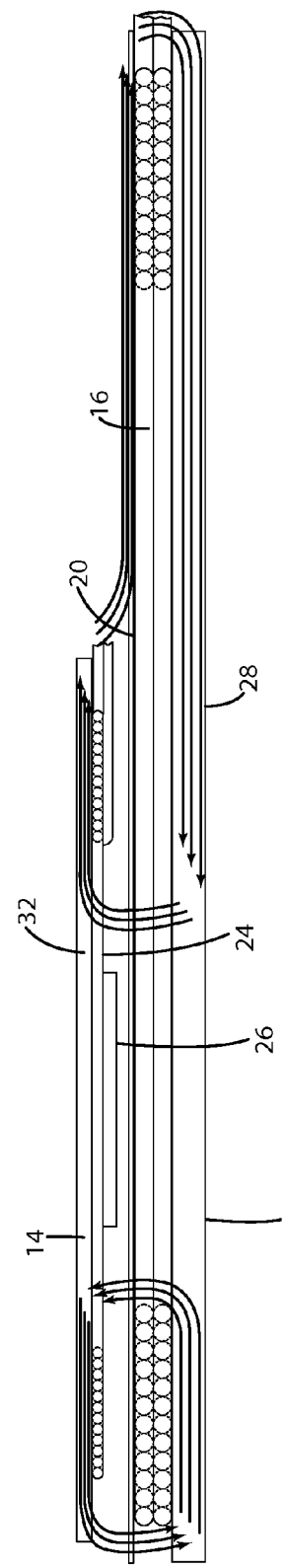
Figure 11:
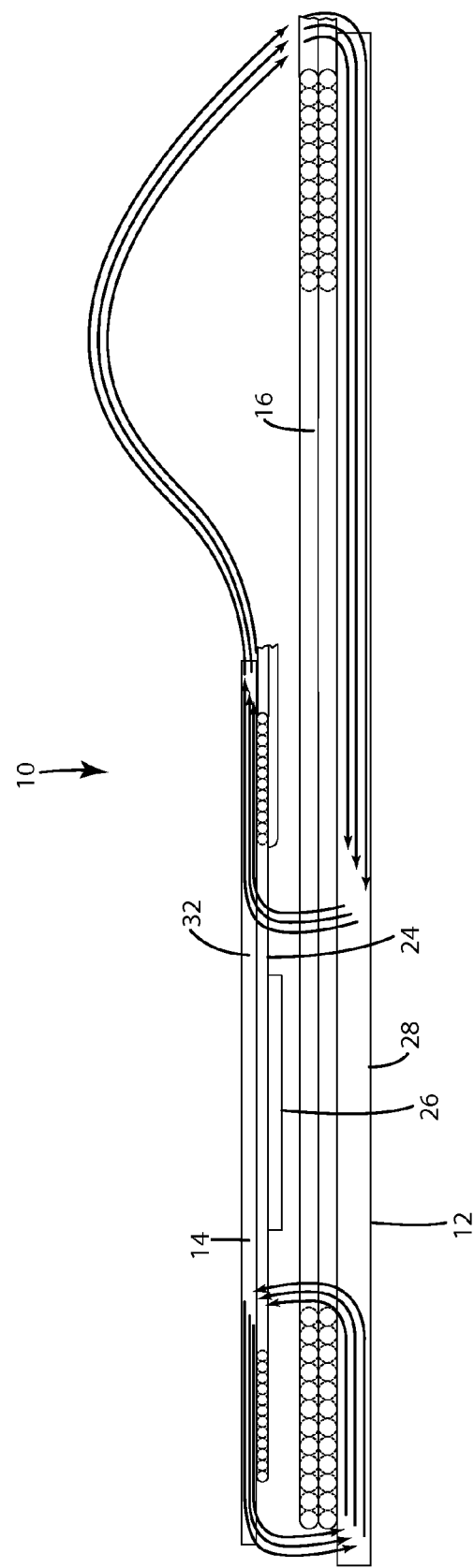
FIG. 11 is a representation of magnetic flux lines if there were no intermediate shield present.

As noted above, the intermediate shield 20 largely controls the flow the magnetic field produced by the primary coil 16 to the secondary coil 24. FIG. 9 provides a representation of the affect of saturation on a magnetic shield. The illustration on the left shows the flow of magnetic field lines through the shield. The illustration on the right shows how the shield loses its ability to draw in and guide the magnetic field when it is substantially saturated by a magnet. This control is accomplished by biasing the magnetic domains in a localized region of the intermediate shield when an external permanent magnetic field is near it. When no external permanent magnet is near the intermediate shield, it minimizes the magnetic field from escaping into the environment. FIG. 8 is an illustration showing how the magnetic field lines may be directed through the intermediate shield 20 of the illustrated embodiment. As can be seen, the magnetic field generated by the primary coil 16 flows in a somewhat closed loop through the supplemental shield 28 and the intermediate shield 20. However, when the external magnet is near the intermediate shield, the permanent magnetic biases the material and creates a saturated region where the permeability approaches that of air (a value of 1.0). This allows the magnetic field from the primary coil to penetrate through the intermediate shield to engage with the secondary coil. FIG. 10 is an illustration showing how the magnetic field lines may flow when a portion of the intermediate shield 20 is saturated. As can be seen, the magnetic field generated by the primary coil 16 flows in large part through the intermediate shield 20 until it reaches the region saturated by the magnet 26. In that region, the magnetic field is more readily able to flow to and couple with the secondary coil 24. If the system did not include the intermediate shield 20, then more stray magnetic field would leak to the environment. FIG. 11 is a representative illustration showing how the magnetic field lines might flow in the system 10 in the absence of intermediate shield 20. Stray magnetic field typically equates to increased losses. This could be of most notable concern in cases where parasitic metal objects might intersect the leaked field.

The external magnetic field can be configured to saturate various sized regions balancing type, size and quantity of permanent magnets with the type and thickness of the intermediate shield. The balance in design between the intermediate shield that needs to saturate easily and a more robust harder to saturate shielding material like pressed iron can allow a full system to shield effectively while allowing an aperture to be formed. Using a highly directional magnet or array of magnets can make this mechanism very region specific, and hence make it easier to saturate only one or more portions of the flux guide at any time.

Figure 14B:
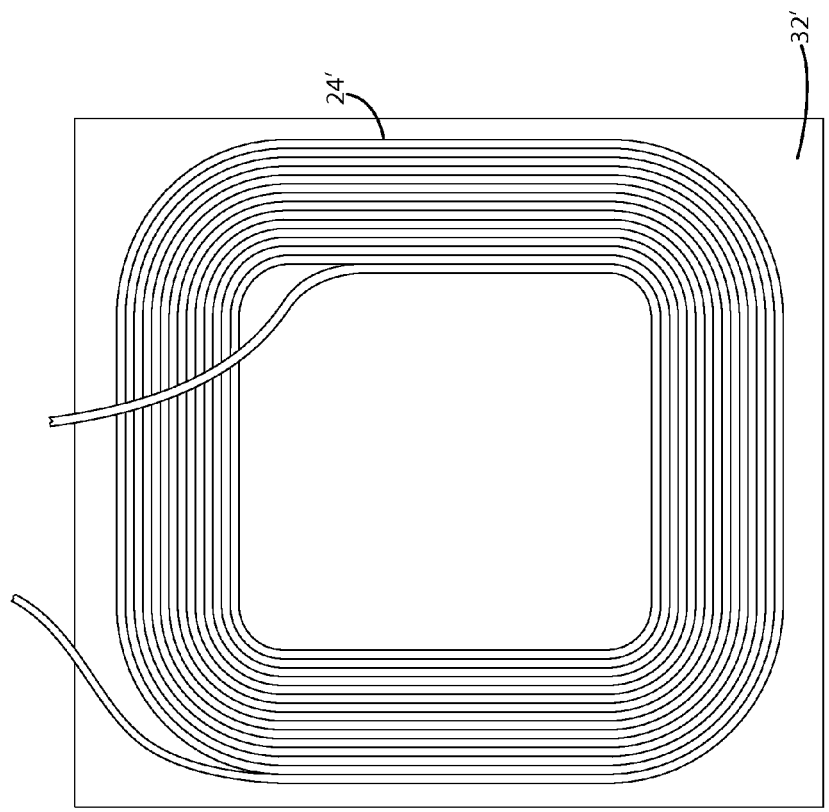
FIG. 14B shows a secondary coil that was used in the lab tests.
Figure 14A:
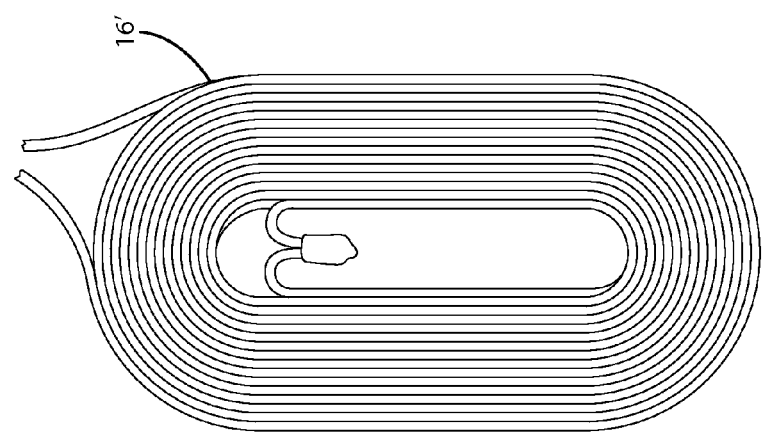
FIG. 14A shows a primary coil that was used in one set of lab tests.
Figure 16D:
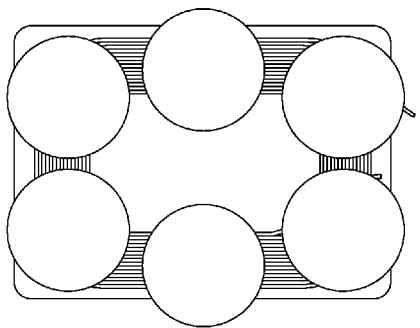
FIGS. 16A-H shows various configurations of permanent magnets that were used in one set of lab tests.
Figure 16H:
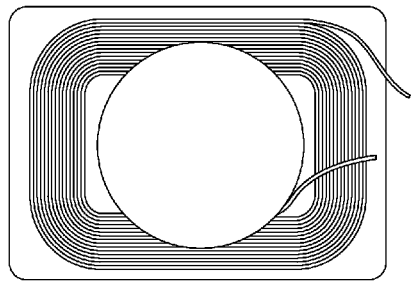
Figure 16C:
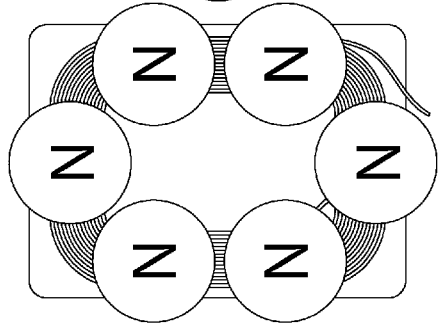
Figure 16G:
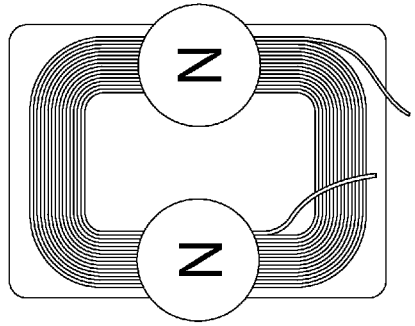
Figure 16B:
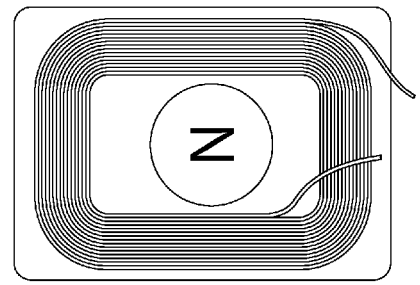
Figure 16F:
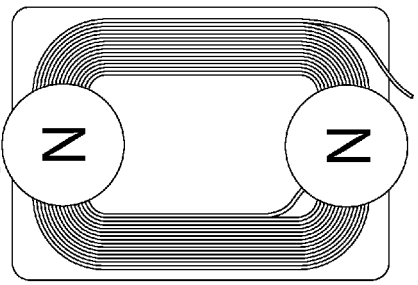
Figure 16A:
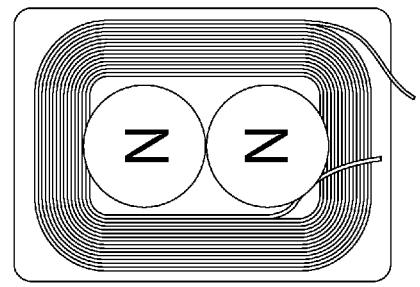
Figure 16E:
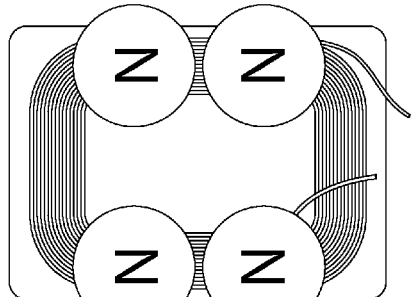

Although the magnet 26 of the illustrated embodiment is a single permanent magnet, the remote device 14 may include a plurality of magnets. The magnets may be arranged in different patterns to create apertures of different sizes and shapes. For example, FIGS. 16A-H shows a variety of potential alternative magnet arrangements. Each of these illustrations shows a possible configuration of magnets with respect to the secondary coil. Different magnet arrangements may result in the formation of apertures of different sizes, shapes and characteristics. FIGS. 17A-F provide information relevant to understanding the impact of magnet arrangements on aperture characteristics. These illustrations show the results of tests performed in the lab on a single primary coil and secondary coil pair. FIGS. 14A and 14B shows the primary coil 16' and secondary coil 24' used to perform these tests. The primary coil 16' is a two-layer primary coil with 26 total turns (13 turns in each layer) of Litz wire. The primary coil 16' is approximately 50 mm by 100 mm. The secondary coil 24' is a single layer, planar coil of solid wire. The secondary coil 24' has 15 turns of wire and is approximately 30 mm by 40 mm. The secondary coil 24' is mounted to a supplemental shield 32'. To perform the tests, magnet(s) were placed over the primary coil 16' and the primary coil 16' was energized. The secondary coil 24' was then swept over the primary coil 16' and magnet(s) 26' and the voltage induced in the secondary coil 24' was recorded. The data collected from these tests was used to develop the voltage response maps shown in FIGS. 17A-F. FIG. 17A shows the results of a single bonded NdFeB magnet. FIG. 17B shows the results of a test involving two adjacent bonded NdFeB magnets. FIG. 17C shows the results when the test was performed with the shown pattern of ferrite magnets. FIG. 17D shows the results of essentially the same pattern, but with bonded NdFeB magnets. As can be seen, the bonded NdFeB magnets produced significantly greater aperture. FIG. 17E shows an arrangement of six magnets in which the polarity of the magnets alternates as indicated by the variation in color of the magnets. FIG. 17F shows a similar arrangement of six magnets in which the polarity of the magnets is not varied.

Laboratory tests demonstrate that the efficiency of the power transfer can be dramatically varied by selectively saturating the shield. FIG. 18A shows the efficiency of power transfer achieved in a shielded system when no magnet is present. With an intermediate shield manufactured from Flexield IRJ09, the wireless power transfer occurred with an efficiency of roughly 14.546%. With an intermediate shield manufactured from pre-fractured ferrite, the efficiency was roughly 14.585%. Saturation of the shielding material significantly improved the results. FIG. 18B shows the efficiency of power transfer achieved in a system when a magnet is present. With an intermediate shield manufactured from Flexield IRJ09, the wireless power transfer in the presence of a magnet occurred with an efficiency of roughly 82.141%. With an intermediate shield manufactured from pre-fractured ferrite, the efficiency in the presence of a magnet was roughly 42.802%.

Figure 19:
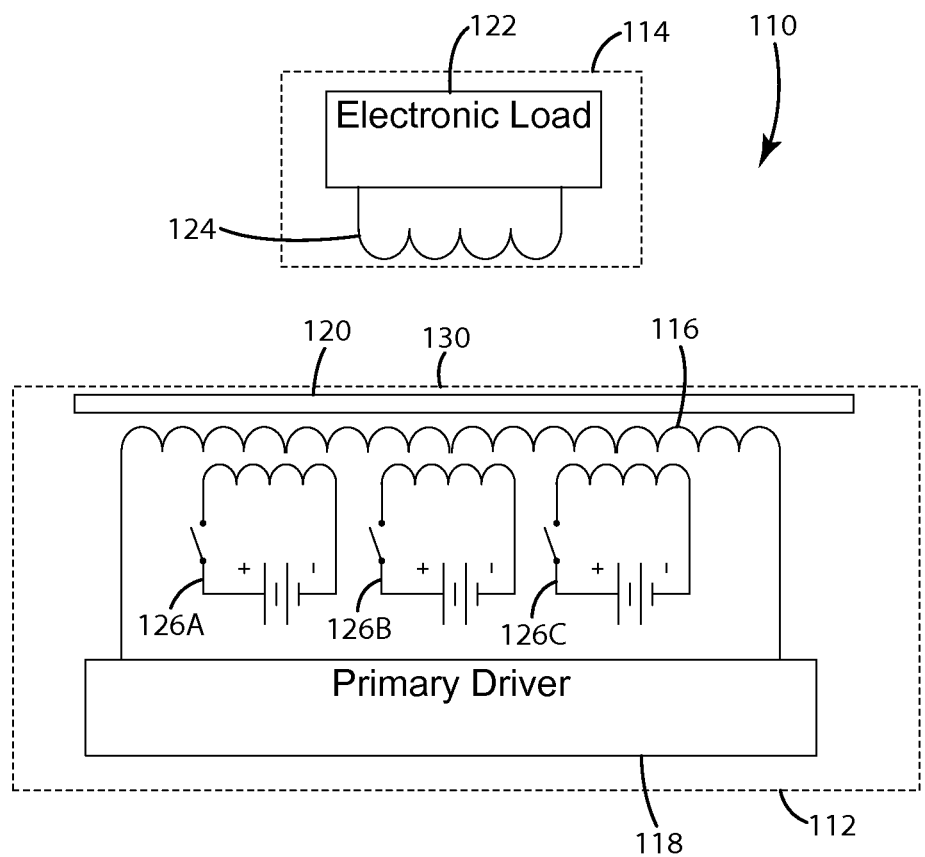
FIG. 19 is a block diagram of an alternative embodiment of the present invention.
Figure 20:
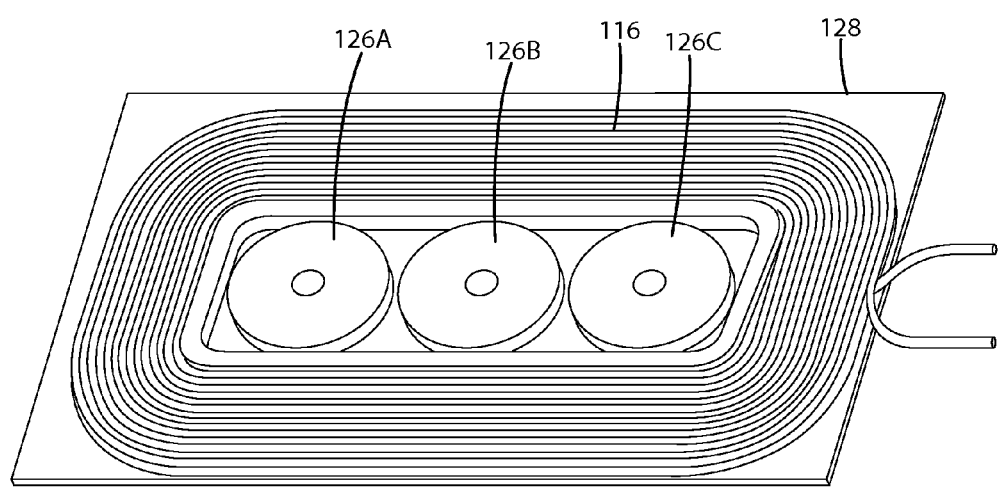
FIG. 20 is a top perspective view of a portion of the wireless power supply of the alternative embodiment of FIG. 19.
Figure 21:
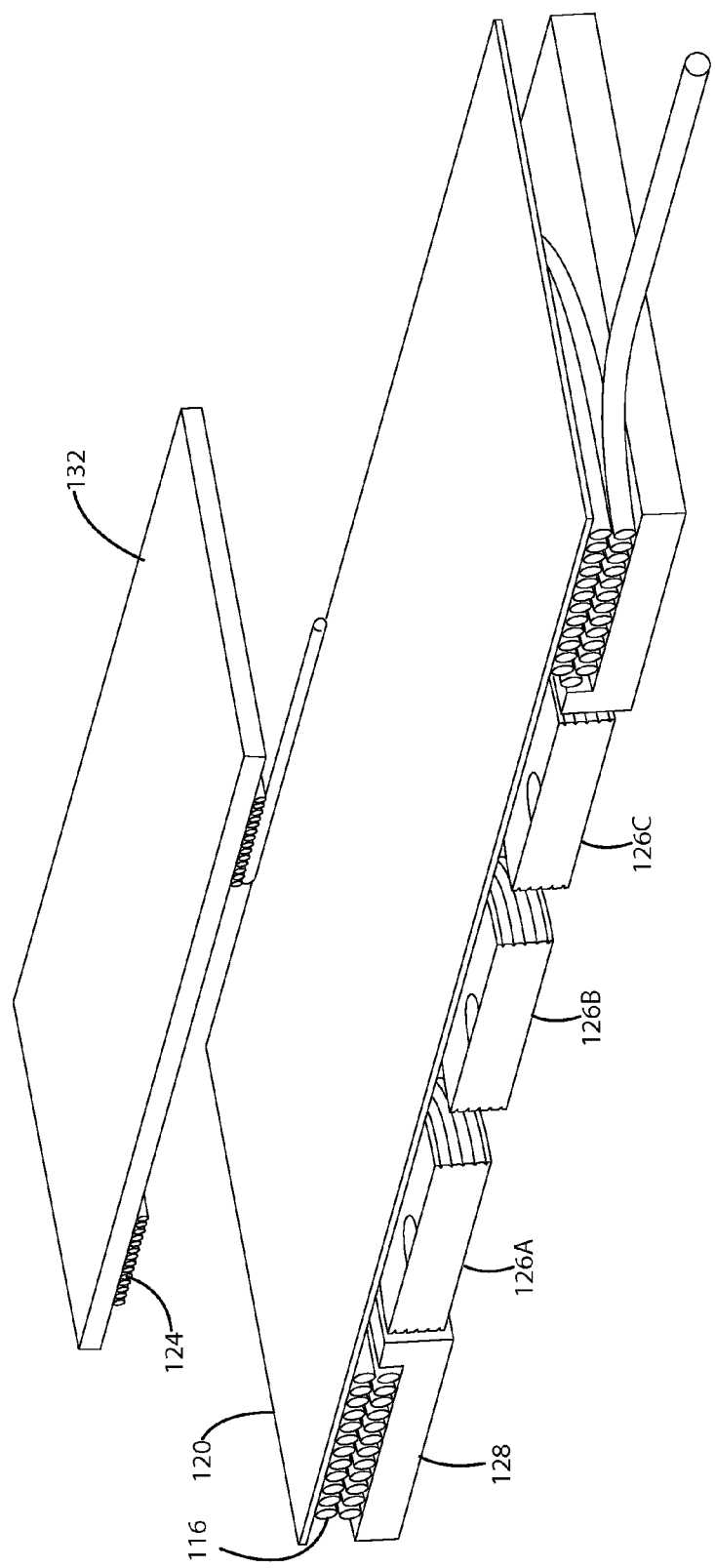
FIG. 21 is a cut-away perspective view of a portion of the wireless power supply of the alternative embodiment of FIG. 19.

In the embodiment illustrated in FIGS. 1-6, 8, 10 and 11, the intermediate shield 20 is selectively saturated by a permanent magnet 26 that is carried by the remote device 14. That embodiment permits the saturating magnetic field source to always remain with the remote device 14 so that the aperture is automatically generated in alignment with the secondary coil 24 where ever it might be placed on the charging surface 30. This approach may not always be desirable. For example, in some applications, it may not be desirable to have a permanent magnet in the remote device. As an alternative, the saturating magnetic field source may be incorporated into the wireless power supply. An alternative embodiment of the present invention is shown in FIGS. 19-21. The wireless power supply 112 of this embodiment includes a primary coil 116, a primary driver 118, an intermediate magnetic shield 120 and a plurality of electromagnets 126a-c (See FIG. 19). The remote device 114 of this embodiment includes an electronic load 122 and a secondary coil 124. The remote device 114 includes no permanent magnet 26. As shown in FIGS. 20 and 21, the wireless power supply 112 and the remote device 114 may include supplemental shields, 128 and 132 respectively.

Referring now to FIGS. 20 and 21, the electromagnets 126a-c may be disposed in the center of the primary coil 116. For example, the electromagnets 126a-c may be evenly spaced across the central opening of the primary coil 116. The electromagnets may, however, be located in other locations, such as above, below or outside the outer perimeter of the coil. In this embodiment, the wireless power supply 112 includes a plurality of DC electromagnets 126a-c that can be selectively energized to create a magnetic field to substantially saturate all or a portion of the intermediate shield 120. Although this embodiment shows three electromagnets, the number of electromagnets may vary. For example, it may be desirable to include only a single electromagnet in some applications. In other applications, it may be desirable to include more than three electromagnets, for example, with longer coils or in situations where the strength of each individual electromagnet is lower.

The wireless power supply may vary the power transmitted to the remote device by using any number variances to the voltage, frequency, duty cycle, phase or resonant frequency of the wireless power supply circuitry 118. However, the wireless power supply may also vary the saturation level of the shield by varying the magnetic field strength of the electromagnets 126a-c disposed in the wireless power supply.

The function of the intermediate shield 120 in this embodiment is identical to that described in the preceding embodiment. However, in this embodiment the method of saturating the intermediate shield in a localized region is accomplished by selectively energizing one or more DC electromagnets 126a-c in the wireless power supply. As with magnet 26, the DC electromagnet that is energized in a particular region creates a magnetic field that opens a localized aperture for the transmission of the wireless power to the secondary device in that region.

The method for determining which electromagnet(s) to engage may vary from application. In one embodiment, the method may include sequentially energizing the electromagnets one at a time and checking for the presence of a remote device. For example, with three electromagnets, the wireless power supply may activate the first electromagnet to open a first aperture and then perform a "ping" to check for the presence of a remote device. The pinging process may include the steps of energizing the primary coil with a short pulse of power to generate a magnetic field and monitoring a characteristic of the power, such as current, in the wireless power supply to determine if a potential device is present. If a potential remote device is present, the remote device will draw power from the magnetic field and the reflected impedance of the remote device will cause an increase in the current in the wireless power supply. As an alternative method, the pinging process may include the step of looking for changes in capacitance in electrodes placed on or near the charging surface. If no potential device is present through the first aperture, the wireless power supply may deactivate the first electromagnet, activate the second electromagnet to open a second aperture and then perform a second ping to check for a potential device through the second aperture. If no potential device is present through the second aperture, the wireless power supply may deactivate the second electromagnet, activate the third electromagnet to open a third aperture and then perform a third ping to check for a potential device through the third aperture. The process of cycling through the electromagnets (and consequently the different apertures) may continue periodically until a remote device is found. Once found, the appropriate electromagnet(s) may be energized to provide an aperture of the desired size in the desired location.

In some applications, it may be desirable to energize the primary only when a remote device is present. In applications where the saturating magnet is carried by the remote device, the wireless power supply may occasionally "ping" for the presence of a potential remote device just as though the magnetic shielding was not present. Various systems and methods for detecting the presence of a remote device on a charging surface are well known and therefore will not be described in detail. However, in one embodiment, the wireless power supply may recognize the presence of a potential remote device by periodically applying power to the primary and assessing a characteristic of power that varies depending on whether or not a potential remote device is present. For example, the wireless power supply may ping for a remote device by applying a small amount of power to the primary and monitoring the current in the primary (or in the tank circuit) to determine if a potential remote device is present. If so, the wireless power supply may begin the supply of power. As an alternative to supplying power to the coil, the pinging process may include the step of looking for changes in capacitance in electrodes placed on or near the charging surface.

In embodiments that include a wireless power supply with one or more electromagnets, the method for determining when to energize the primary is similar to the above described method for determining which electromagnet to energize. In embodiments with a single electromagnet, the wireless power supply may temporarily activate the electromagnet to open an aperture in the intermediate shield and ping for the presence of a remote device while the aperture is open. If the wireless power supply includes a plurality of electromagnets, the wireless power supply may separately cycle through the electromagnets one at a time. For example, with two electromagnets, the wireless power supply may activate the first electromagnet to open a first aperture and then perform a ping to check for the presence of a remote device. If no potential device is present through the first aperture, the wireless power supply may deactivate the first electromagnet, activate the second electromagnet to open a second aperture and then perform a ping to check for a potential device through the second aperture. The process of cycling through the electromagnets (and consequently the different apertures) may continue until a remote device is found. Once a remote device is found, the primary may be energized. In application with a plurality of electromagnets, the appropriate electromagnet(s) will also be energized once a remote device is found. The process of detecting a remote device may alternatively or in addition include an exchange of communications between the wireless power supply and the remote device. For example, if the "pinging" process indicates that a potential remote device is present, the wireless power supply may solicit a communication from the remote device to confirm that it is a compatible device (e.g. a device capable of receiving power from the wireless power supply). Alternatively, the remote device may be configured to send an unsolicited communication confirming that it is a compatible device when in the presence of a wireless power transfer field.

Figure 22:
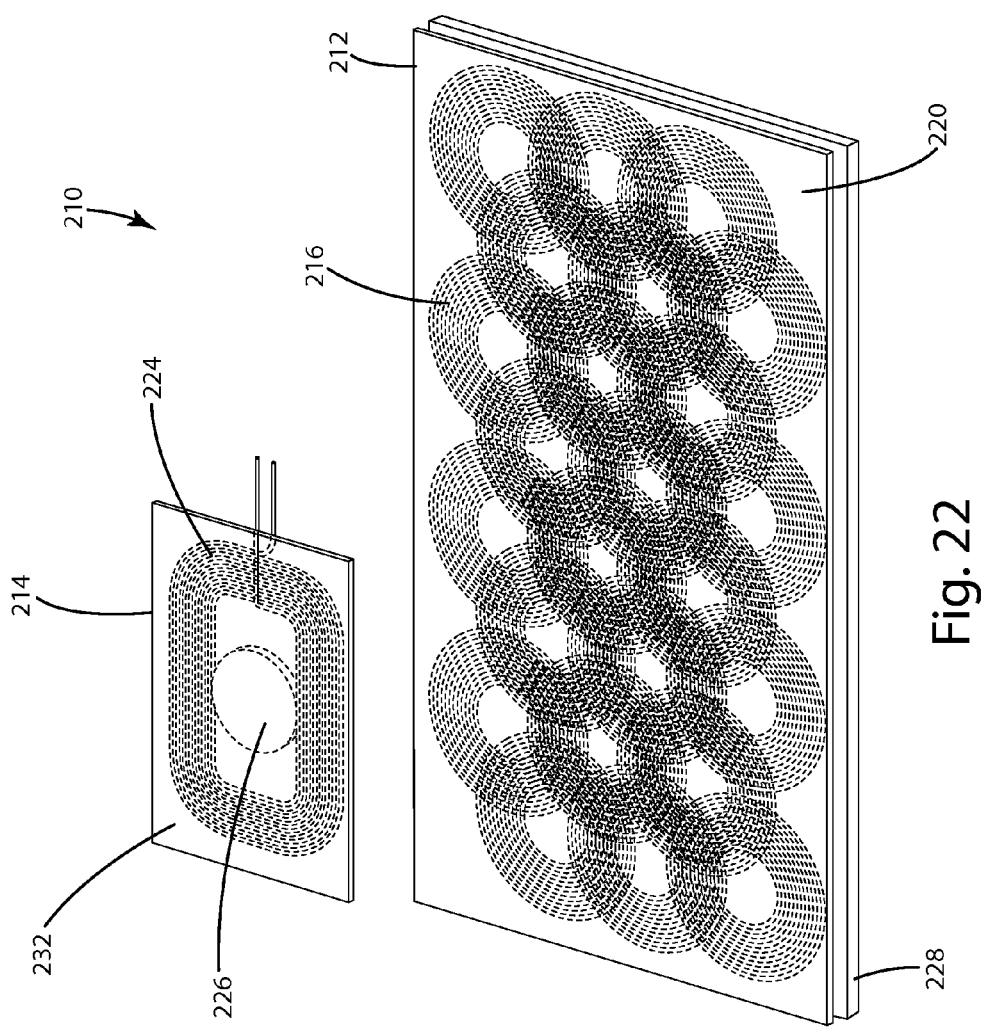
FIG. 22 is a perspective view of an alternative embodiment including an array of primary coils.
Figure 23:
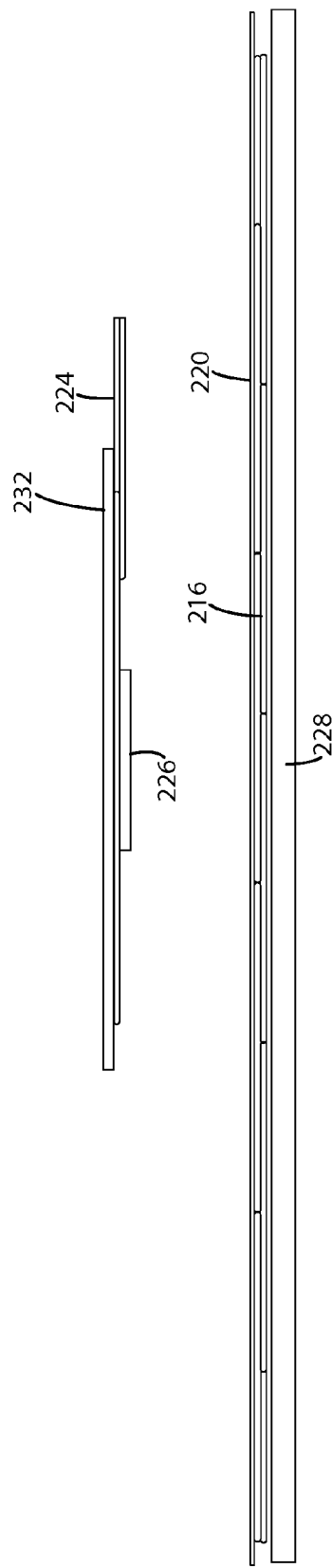
FIG. 23 is side elevational view of the alternative embodiment of FIG. 22.

The present invention may also be incorporated into a wireless power supply that includes an array of primary coils. An embodiment with an array of primary coils is shown in FIGS. 22 and 23. The wireless power supply system 210 may include a wireless power supply 212 having a plurality of primary coils 216, an intermediate magnetic shield 220 and a supplemental shield 228. Although the primary coils 216 are disposed below the intermediate shield 220, the hidden coils are made visible through the intermediate shield 220 in FIG. 22 for purposes of disclosure. The wireless power supply 212 may also include driver circuitry (not shown) capable of individually energizing a single primary coil or two or more coils in combination. Typically, the wireless power supply 212 will energize the primary coil or primary coils that are in the best location to deliver power to the remote device 214. In this embodiment, the wireless power supply 212 includes two layers of primary coils arranged in an overlapping configuration (See FIG. 23). The configuration of the coil array may, however, vary from application to application.

The remote device 214 of this embodiment may include a secondary coil 224, a magnet 226 and a supplemental shield 232. Although the secondary coil 224 and magnet 226 are disposed below the supplemental shield 232, the hidden coil and magnet are made visible through the supplemental shield 232 in FIG. 22. In use, the magnet 226 produces an aperture in the intermediate shield 220 adjacent to the remote device 214 to allow the magnetic field to couple with the remote device 214 with improved efficiency. Alternatively, the magnet 226 may be replaced by a plurality of electromagnets in the wireless power supply 212. For example, the wireless power supply 212 may include an array of electromagnets that can be energize individually or in sets to generate an aperture of the appropriate size and location in the intermediate shield 220.

Figure 24:
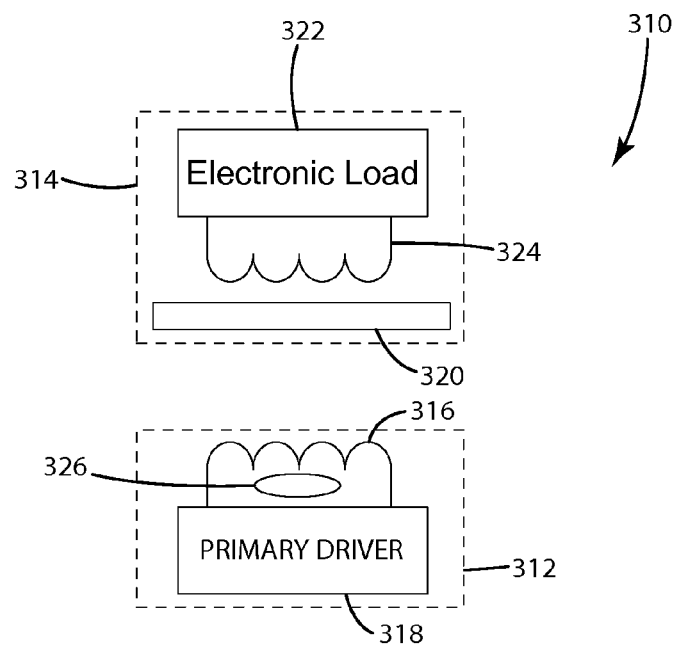
FIG. 24 is a block diagram of an alternative embodiment with the intermediate shielding in the remote device.

The previously described embodiments disclose wireless power supply systems in which the intermediate shield is disposed in the wireless power supply. In some applications, it may be desirable to incorporate the intermediate shield into the remote device. For example, it may be desirable to provide a remote device that is generally shielded from certain external magnetic fields. FIG. 24 shows an alternative embodiment of a wireless power supply system 310 in which the intermediate shield 320 is incorporated into the remote device 314. The wireless power supply 312 of this embodiment includes a primary coil 316, a primary driver 318 and a permanent magnet 326. The remote device 314 of this embodiment includes an electronic load 322, an intermediate magnetic shield 320 and a secondary coil 324. Although not shown, the wireless power supply 312 and the remote device 314 may include supplemental shields. When the remote device 314 is placed adjacent to the wireless power supply 312, the magnet 326 will saturate the intermediate shield 320 in the remote device 314 and open an aperture to allow magnetic fields to reach the secondary coil 324. Although shown as a permanent magnet, magnet 326 may alternatively be one or more electromagnets. For example, with a large primary coil 316, it may be desirable to have an arrangement of electromagnets that can be selectively used to open an aperture through the shield 320 in only a localized region corresponding with the position of the remote device 314.

In some applications, it may be desirable to incorporate intermediate shielding into both the wireless power supply and the remote device (not shown). In such applications, one or more electromagnets may be located in the wireless power supply and/or the remote device to selectively saturate the intermediate shields. Alternatively, a magnetic field source (e.g. a permanent magnet or an electromagnet) external to both the wireless power supply and the remote device may be used to selectively saturate the intermediate shields.

Figure 25:
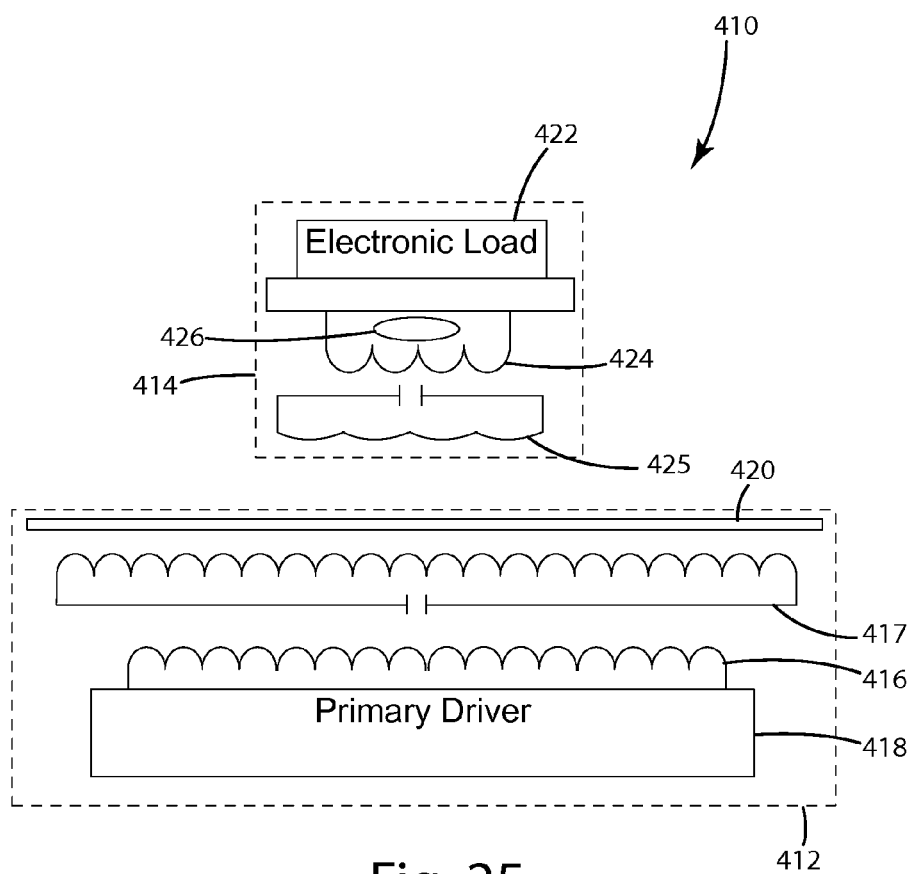
FIG. 25 is a block diagram of an alternative embodiment in which the wireless power supply and remote device include resonating coils.

The present invention may also be used with wireless power supply systems that incorporate isolated resonating coils. For example, as shown in FIG. 25, the wireless power supply system 410 may include a wireless power supply 412 having a primary coil 416, a primary resonating coil 417 and an intermediate magnetic shield 420. The remote device 414 of this embodiment may include a secondary coil 424, a secondary resonating coil 425, a magnet 426 and an electronic load 422. Resonating coils are generally well-known and therefore will not be disclosed in detail. Suffice it to say that, in use, the primary coil 416 energizes the primary resonating coil 417 which in turn generates an electromagnetic field that is intended to couple with and transfer energy to the secondary resonating coil 425. The secondary resonating coil 425 in turn generates an electromagnetic field that couples with and induces current in the secondary coil 424. The intermediate shield 420 may be disposed between the primary resonating coil 417 and the secondary resonating coil 425.

Figure 28:
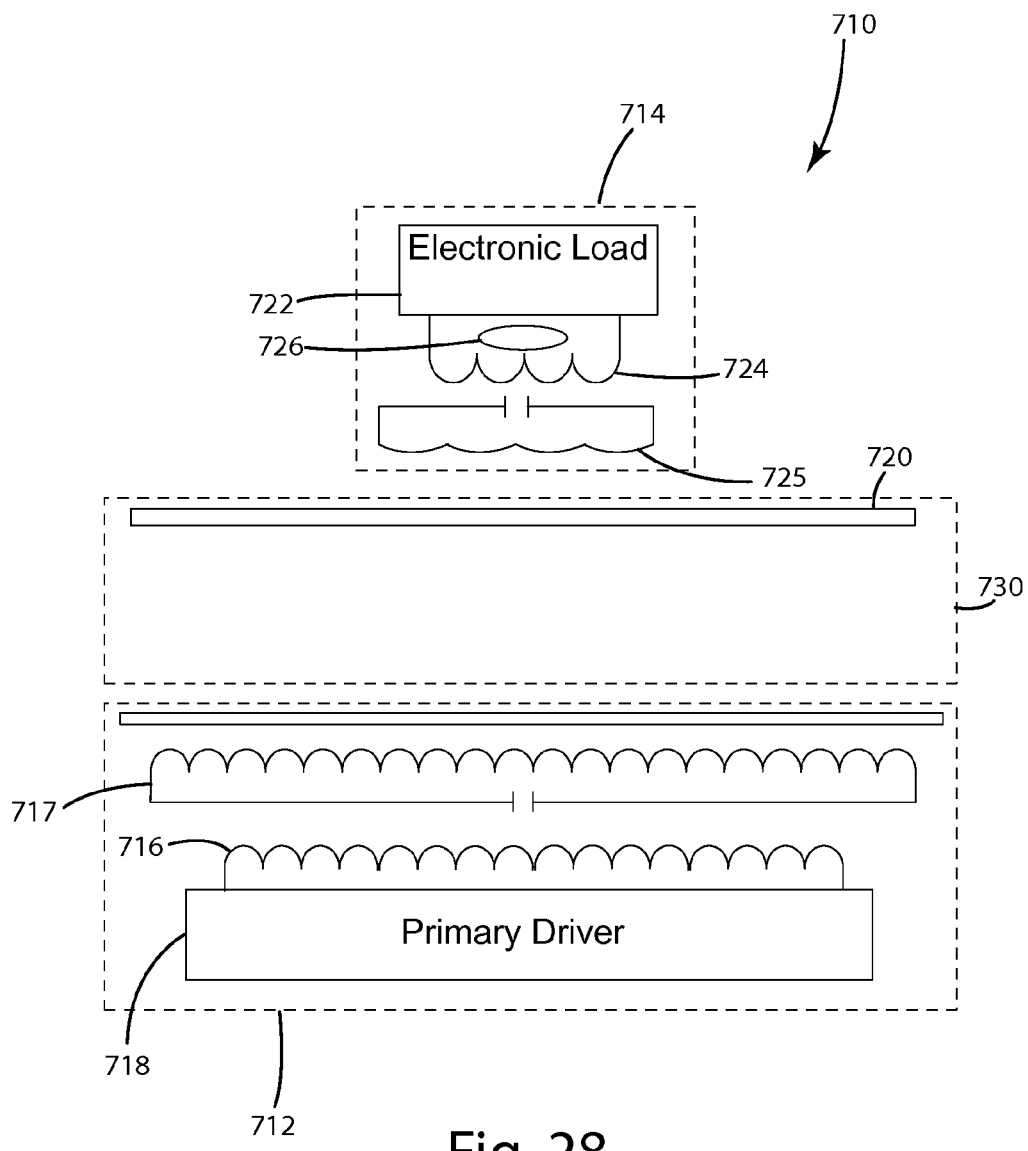
FIG. 28 is a block diagram of an alternative embodiment in which the wireless power supply and remote device include resonating coils.

Another embodiment of the present invention with a wireless power supply system that incorporates isolated resonating coils is illustrated in FIG. 28. The wireless power supply system 710 may include a wireless power supply 712 having a primary coil 716, a primary resonating coil 717 and an intermediate magnetic shield 720. The intermediate magnetic shield 720 may attached to or integrated with a separate entity 730, different from the wireless power supply 712. The remote device 714 of this embodiment may include a secondary coil 724, a secondary resonating coil 725, a magnet 726 and an electronic load 722. Resonating coils are generally well-known and therefore will not be disclosed in detail. Suffice it to say that, in use, the primary coil 716 energizes the primary resonating coil 717 which in turn generates an electromagnetic field that is intended to couple with and transfer energy to the secondary resonating coil 725. The secondary resonating coil 725 in turn generates an electromagnetic field that couples with and induces current in the secondary coil 724. One difference between the FIG. 25 embodiment and the FIG. 28 embodiment is that the FIG. 28 embodiment includes some spacing between the coils and shielding.

Figure 26:
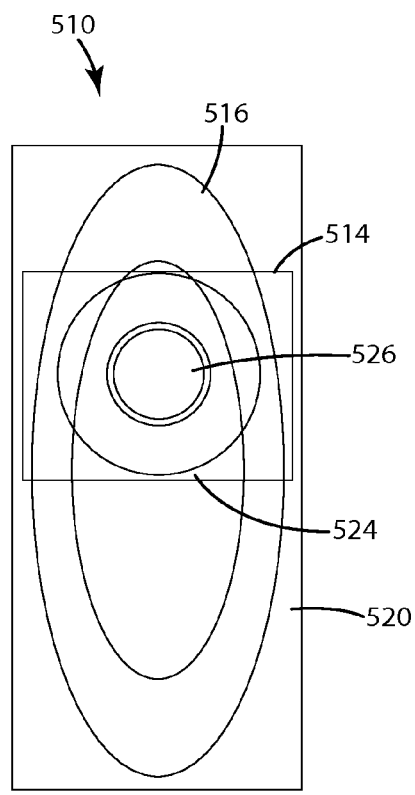
FIG. 26 is a representational view of an alternative embodiment that includes an oval primary coil with a magnet in the remote device.

Positioning the shielding on or within a separate entity, separate from the wireless power supply is possible in other embodiments as well. For example, in FIG. 1, the intermediate magnetic shield 20 may be removed from the inductive wireless power supply and instead be part of a separate entity as shown in FIG. 28. It can be useful for the intermediate shielding to be located away from the wireless power supply, and in particular, a distance from the primary coil. Having a separate entity carry the intermediate shielding can allow the shielding to be closer to the remote device without externally exposing the shielding. Further, because the shielding is attached to or integrated within a separate entity it can still be protected from external forces. In one embodiment, the separate entity is a surface such as countertop, table, or essentially any other surface capable of having remote devices positioned adjacent to the surface. The surface can be generally made of any conventional surface material, such as Formica, wood veneer or another laminate. The intermediate shield can be integrated with the surface during manufacture or it can be installed during installation of the surface. The position of the intermediate shielding within the surface 730 dictates the distance between the primary coil and the intermediate shielding. As shown in FIG. 28, the intermediate shielding can be located near the top of the surface. This keeps the shielding close to the devices but the consumer will not be exposed and the material is protected. Further, this configuration allows the intermediate shielding to be located a distance from the primary coil 717, which may be desirable in some circumstances Another alternative embodiment of the present invention is shown in FIG. 26. In this embodiment, the wireless power supply system 510 includes a wireless power supply 512 with a oval primary coil 516 and an intermediate shield 520 disposed over the entire length of the oval primary coil 516. Although FIG. 26 shows an oval coil of a particular size, the size of the coil, including its length, may vary from application to application. For example, the oval primary coil may be of sufficient length to extend along the full length of a desk or other work surface. In the embodiment of FIG. 26, the remote device 514 includes a secondary coil 524 and a magnet 526 that selectively saturates the intermediate shield 520 is a location adjacent to the secondary coil 524. The intermediate shield 520 largely contains the magnetic field along the entire length of the shield 520 excluding only those regions that may be saturated to form apertures in the shield.

Figure 29A:
FIG. 29A-B are representational views of a wireless power supply.
Figure 29B:
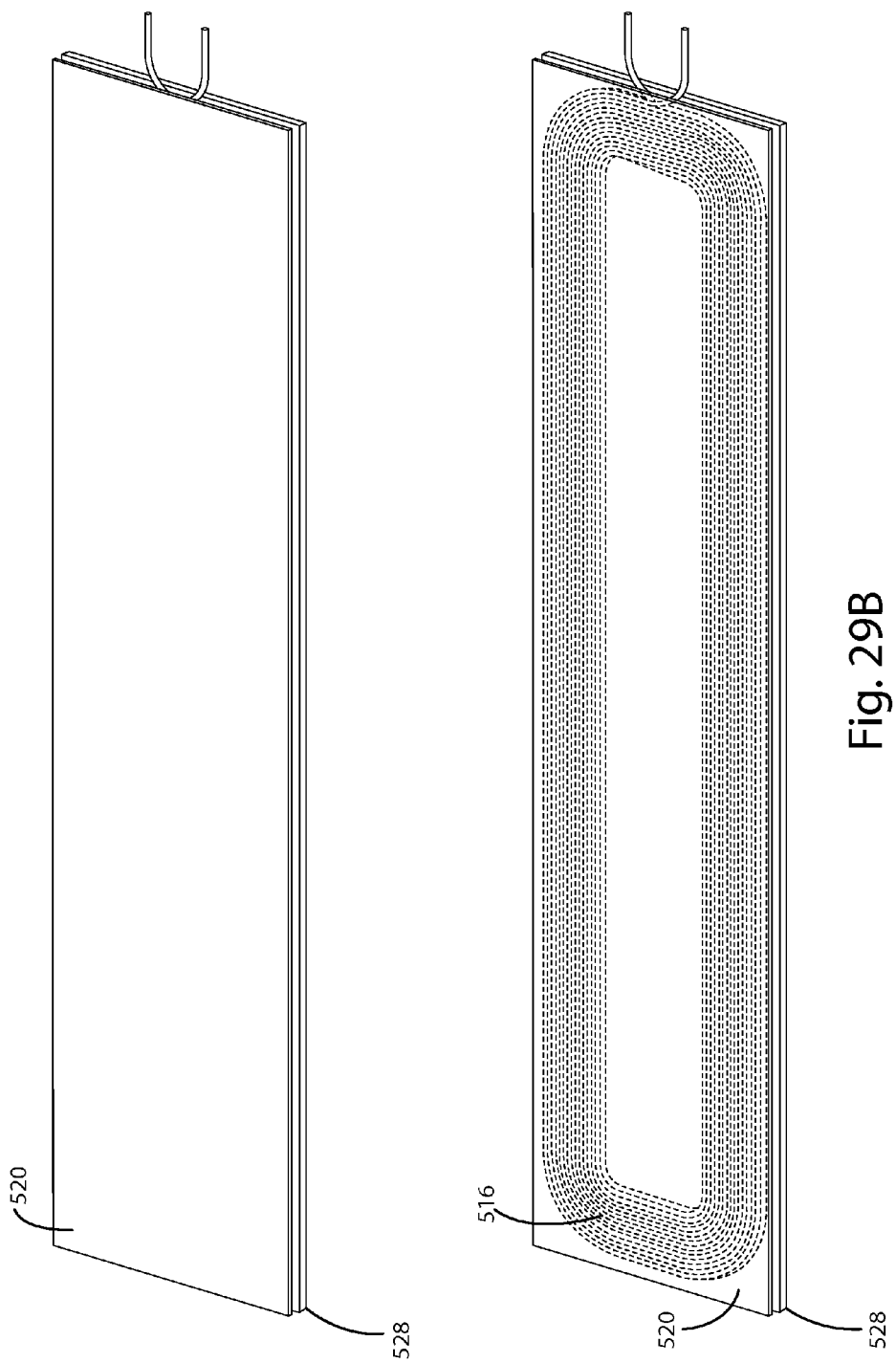

Some additional illustrations of the intermediate shield 520 and primary oval coil 516 are shown in FIGS. 29A and 29B. FIG. 29A illustrates a perspective view and a top view of the wireless power supply 512 where the intermediate shield is hidden and the oval primary coil 516 is visible. An optional supplemental shield 528 extends below the primary oval coil. FIG. 29B illustrates a perspective view and a top view of the wireless power supply 512 where the intermediate shield is shown and the primary oval coil 516 is shown in hidden lines. An optional supplemental shield 528 extends below the primary oval coil.

Figure 27:
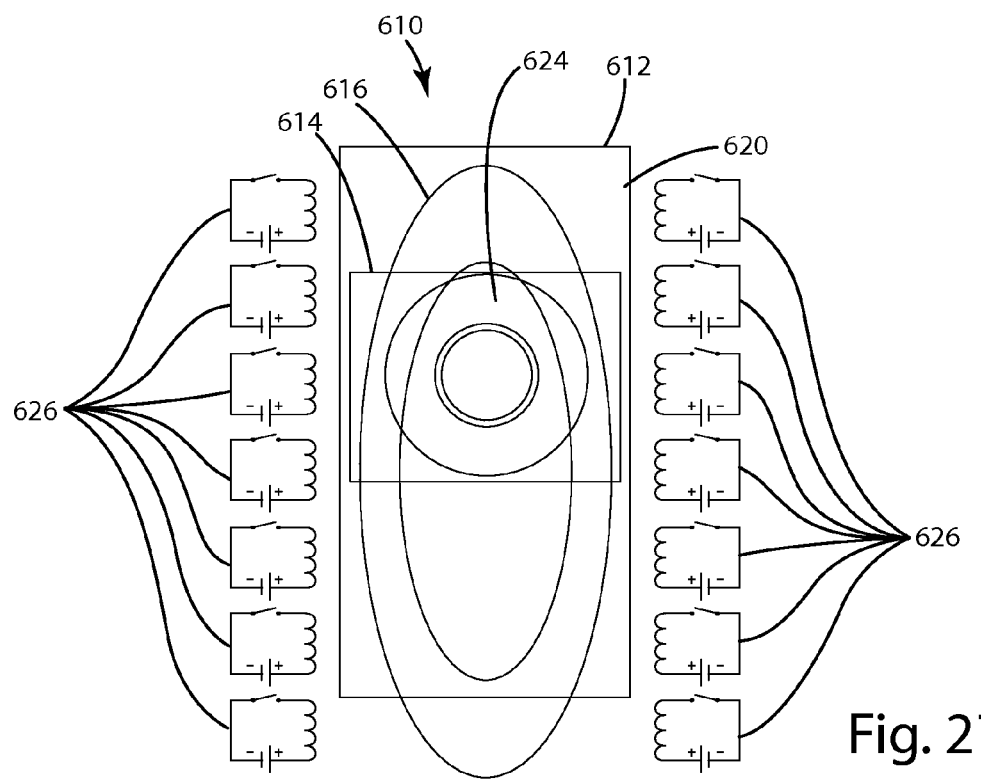
FIG. 27 is a representational view of an alternative embodiment that includes an oval primary coil and electromagnets in the wireless power supply.

Although FIG. 26 uses a magnet 526 in the remote device 514 to selectively open an aperture in the intermediate shield 520, the system may alternatively use electromagnets in the wireless power supply to generate the apertures. FIG. 27 shows an alternative wireless power supply system 610 having a wireless power supply 612 that includes an oval primary coil 616 and a plurality of electromagnets 626 to selectively saturate the intermediate shield 620. In this embodiment, the remote device 614 includes a secondary coil 624, but no magnet. The electromagnets 626 may be energized in alignment with the position of the secondary coil 624 to saturate the shield 620 and allow inductive power transfer. The electromagnets 626 may be energized individually or in combination. For example, a plurality of electromagnets may be energized to provide power to more than one remote device or to produce a larger aperture than might be possible with a single electromagnet. For example, in the configuration shown in FIG. 27, it may be desirable to energize the four bracketed electromagnets 626 to open an aperture to provide power to the remote device 614 in the illustrated position.

Figure 30A:
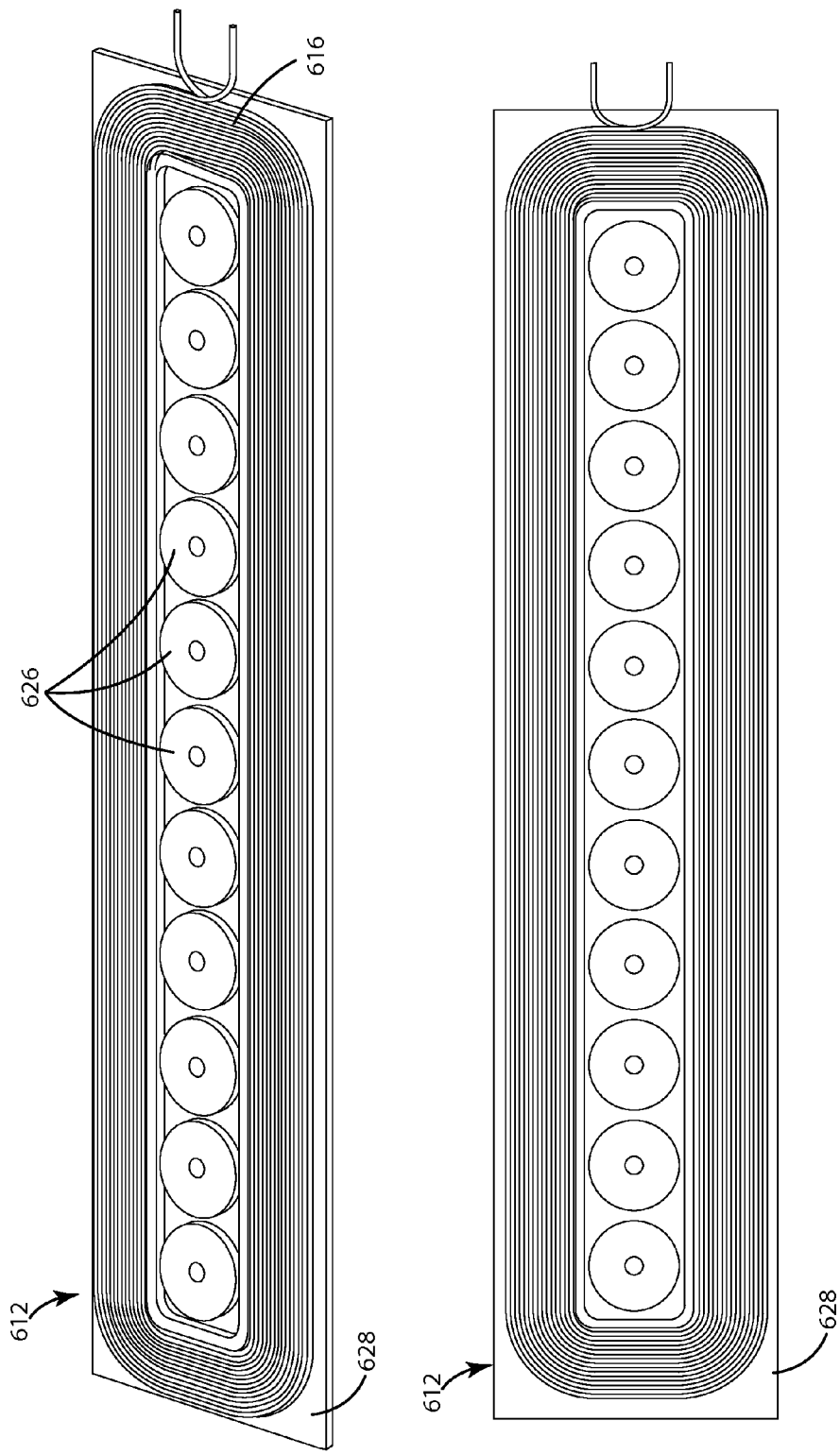

In one embodiment, illustrated in FIGS. 30A-B, electromagnets are located along the center of the primary oval coil. FIG. 30A illustrates a perspective view and a top view of the wireless power supply 612 where the intermediate shield is hidden and the DC electromagnets 626 and the oval primary coil 616 are visible. An optional supplemental shield 628 extends below the primary oval coil and electromagnets. FIG. 30B illustrates a perspective view and a top view of the wireless power supply 612 where the intermediate shield is shown and the DC electromagnets 626 and the primary oval coil 616 are shown in hidden lines. An optional supplemental shield 628 extends below the primary oval coil. In the configuration shown in FIGS. 30A-B, it may be desirable to energize one or more of the electromagnets 626 to open an aperture to provide power to a remote device located in proximity to the electromagnets.

As discussed above, the present invention provides the ability to open a window through a magnetic shield on demand that allows the magnetic field (e.g. power or communications) to permeate while being able to close this window upon demand. The present invention can be used for metal enclosures allowing a more reliable covering and also more functional enclosures where the aperture allows security from scanning and EMP.

The present invention also provides the ability to minimize the area where wireless power (or other magnetic fields) is allowed to radiate. This can permit a complete shielded cage to surround the wireless power electronics and only open up the areas of the cage needed for wireless power transfer (or other functions carried out by magnetic fields, such as communications). For example, the principles of the present invention can be used to limit the radiated exposure of a wireless power device by shielding the system while still allowing an aperture when and where desired for power transfer.

As can be seen, the present invention provides a mechanism for selectively allowing a magnetic field to pass through an electromagnetic field path. From this perspective, the present invention provides a mechanism for selectively turning on and off the flow of an electromagnet field from one region to another. Accordingly, the present invention provides the ability to have a magnetic power switch that is biased by a magnet or other source of magnetic field.

Another potential application is in the hulls of military vehicles. The shielding materials and techniques described herein can be used to limit EMI/RFI and enhance EMC. These features may be implemented not only in the context of portable electronics, but also in the context of essentially any application that might involve the transmission of magnetic fields. The transfer of power through metals in the hull of an airplane, drone or submarine are examples of potential applications for the present invention. For example, the power source and the vehicle hull can be shielded, but an aperture can be readily opened in the shielding to form an aperture in both surfaces for power transfer or to perform other functions carried out by magnetic fields, such as communications. In some applications, the selective shielding principles of the present invention may permit the use of shielding that protects against certain types of EMP, but that can be selectively opened in a localized region to allow the controlled inflow of electromagnetic fields for various purposes, such as power transfer and wireless communication.

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The invention claimed is:

1. An electromagnetic shielding system for selectively shielding and allowing transmission of wireless power, said electromagnetic shielding system comprising:
   a wireless power supply having an electromagnetic field transmitter for generating an electromagnetic field, said electromagnetic field transmitter being disposed in proximity to a power transfer surface;
   a remote device separate from and positionable on said power transfer surface, said remote device having an electromagnetic field receiver capable of receiving wireless power from said electromagnetic field transmitter via said electromagnetic field;
   an electromagnetic shield adjacent to or forming at least a portion of said power transfer surface, said electromagnetic shield preselected to have a permeability substantially greater than a permeability of ambient space such that said electromagnetic shield when unsaturated provides an electromagnetic flow path of lesser resistance than ambient space, whereby the unsaturated electromagnetic shield shields said electromagnetic field from transferring wireless power via said electromagnetic field to said electromagnetic field receiver; and
   a magnetic field source carried by said remote device, said magnetic field source being separate from the electromagnetic field transmitter and positioned or positionable proximate said electromagnetic shield, said magnetic field source being preselected to generate a magnetic field of sufficient strength such that, in response to generation of said magnetic field in proximity to said electromagnetic shield, at least a portion of said electromagnetic shield substantially saturates where it is desirable to allow the electromagnetic field to pass from said electromagnetic field transmitter to said electromagnetic field receiver, thereby selectively reducing said permeability of said electromagnetic shield such that said electromagnetic shield no longer provides an electromagnetic flow path of lesser resistance than ambient space, whereby said magnetic field source is used to selectively saturate the electromagnetic shield when it is desirable to allow the electromagnetic field to pass from the electromagnetic field transmitter to the electromagnetic field receiver to transfer wireless power thereto, whereby removal of said magnetic field allows said at least a portion of said electromagnetic shield to become unsaturated.

2. The system of claim 1 wherein said magnetic field source is an electromagnet that can be selectively actuated to selectively generate a DC magnetic field of sufficient strength to substantially saturate said electromagnetic shield.

3. The system of claim 2 wherein said magnetic field source includes a plurality of electromagnets arranged in a pattern adjacent said electromagnetic shield, said electromagnets being separately operable to selectively saturate different regions of said electromagnetic shield.

4. The system of claim 1 wherein said magnetic field source is a permanent magnet that is removably positionable near said electromagnetic shield.

5. The system of claim 1 wherein said magnetic field source is a magnet carried by a remote device, whereby placement of the remote device adjacent said electromagnetic shield results in said magnet substantially saturating said electromagnetic field.

6. The system of claim 1 wherein said magnetic field source is capable of selectively varying a strength of said magnetic field.

7. The system of claim 1 wherein said electromagnetic shield is configured to be substantially coextensive with an electromagnetic transfer surface of a wireless power supply.

8. The system of claim 7 wherein said magnetic field source is selected to generate a DC magnetic field of sufficient strength to selectively substantially saturate only a portion of said electromagnetic shield, thereby selectively producing an aperture through said electromagnetic shield.

9. The system of claim 7 wherein said magnetic field source includes a plurality of separately-operable electromagnets arranged in a pattern adjacent said electromagnetic shield, said electromagnets being selectively operable alone or in combination to produce one or more localized apertures in said electromagnetic shield.

10. The system of claim 1 wherein said electromagnetic shield is manufactured from a flexible composite ferrite.

11. The system of claim 1 further including a supplemental shield separate from said electromagnetic shield.

12. The system of claim 11 wherein: said supplemental shield is disposed adjacent an electromagnetic field source for generating an electromagnetic field; and
said magnetic field source configured to selectively substantially saturate at least a portion of said electromagnetic shield without substantially saturating said supplemental shield, whereby actuation of the magnetic field source allows substantially more of the electromagnetic field to pass through said saturated portion of said electromagnetic shield while said supplemental shield continues to contain the electromagnetic shield substantially unchanged by said magnetic field source.

13. The system of claim 12 wherein said supplemental shield and said electromagnetic shield cooperatively substantially surround the electromagnetic field source, whereby the electromagnetic field is substantially contained within said supplemental shield and said electromagnetic shield when said electromagnetic shield is unsaturated.

14. The system of claim 12 wherein said magnetic field source is carried by a remote device having an electromagnetic field receiver, whereby placement of the remote device adjacent said electromagnetic shield positions said magnetic field source to saturate at least a portion of said electromagnetic shield and positions the electromagnetic field receiver to receive the electromagnetic field passing through said saturated portion of said electromagnetic shield.

15. The system of claim 14 wherein said magnetic field source includes a permanent magnet.

16. The system of claim 14 wherein said magnetic field source includes an electromagnet.

17. The system of claim 12 further including a transfer surface of sufficient size to simultaneously receive a plurality of said remote devices, the electromagnetic field source being capable of delivering the electromagnetic field to the remote device disposed anywhere on said transfer surface, said magnetic field source being capable of saturating only a portion of said electromagnetic shield.

18. The system of claim 1 wherein said electromagnetic shield is manufactured from a soft magnetic material having a permeability curve with a first region of high permeability, a second region of low permeability and a transition region between said first region and said second region, said magnetic field source having a field strength selected to transition said electromagnetic shield from said first region to said second region.

19. The system of claim 1 further including:
said electromagnetic shield substantially surrounding said electromagnetic receiver, said electromagnetic shield having sufficient permeability to substantially reduce an efficiency of a coupling between said electromagnetic receiver and an external electromagnetic field source; and
wherein at least a first portion of said electromagnetic shield is manufactured from soft magnetic material having a permeability curve with a first region of high permeability, a second region of low permeability and a transition region between said first region and said second region, said material being readily transitioned from said first region to said second region by a DC magnetic field of appropriate strength.

20. The system of claim 19 wherein said electromagnetic shield includes a supplemental portion manufactured from a material capable of remaining unsaturated when in a DC magnetic field of appropriate strength to substantially saturate said first portion.

21. The system of claim 20 further including an electromagnet, said electromagnet being capable of selectively generating a DC magnetic field of sufficient strength to substantially saturate at least a region of said electromagnetic shield without substantially saturating said supplemental portion of said electromagnetic shield.

22. The system of claim 20 further including a plurality of separately operable electromagnets, each of said electromagnets being capable of selectively generating a DC magnetic field of sufficient strength to substantially saturate an adjacent region of said electromagnetic shield without substantially saturating said supplemental portion of said electromagnetic shield.

23. The system of claim 19 wherein said electromagnetic receiver is capable of receiving wireless communications via an external electromagnetic field.

* * * * *